(12) United States Patent
Miyakawa et al.

(10) Patent No.: US 9,368,199 B2
(45) Date of Patent: Jun. 14, 2016

(54) MEMORY DEVICE

(71) Applicant: KABUSHIKI KAISHA TOSHIBA, Minato-ku, Tokyo (JP)

(72) Inventors: Tadashi Miyakawa, Yokohama Kanagawa (JP); Katsuhiko Hoya, Yokohama Kanagawa (JP); Mariko Iizuka, Yokohama Kanagawa (JP); Hiroyuki Takenaka, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/571,004

(22) Filed: Dec. 15, 2014

(65) Prior Publication Data

US 2016/0064075 A1    Mar. 3, 2016

Related U.S. Application Data

(60) Provisional application No. 62/044,698, filed on Sep. 2, 2014.

(51) Int. Cl.
| | | |
|---|---|---|
| G11C 7/10 | (2006.01) | |
| G11C 7/08 | (2006.01) | |
| G11C 5/06 | (2006.01) | |
| G11C 8/16 | (2006.01) | |
| G11C 13/00 | (2006.01) | |
| G11C 11/16 | (2006.01) | |

(52) U.S. Cl.
CPC .......... *G11C 13/0021* (2013.01); *G11C 11/165* (2013.01); *G11C 7/10* (2013.01); *G11C 7/1012* (2013.01); *G11C 7/1069* (2013.01)

(58) Field of Classification Search
CPC ....... G11C 7/10; G11C 7/1012; G11C 7/1069
USPC ................ 365/51, 63, 148, 158, 163, 189.02, 365/230.02, 230.03
See application file for complete search history.

(56) References Cited

U.S. PATENT DOCUMENTS

| | | | | |
|---|---|---|---|---|
| 4,907,101 A * | 3/1990 | Keesen | ............ | G11B 20/00007 341/60 |
| 5,636,158 A | 6/1997 | Kato et al. | | |
| 5,771,200 A * | 6/1998 | Cho | .......................... | G11C 7/10 365/189.05 |
| 5,822,257 A * | 10/1998 | Ogawa | .................. | G11C 29/783 65/189.02 |
| 6,026,465 A * | 2/2000 | Mills | .................... | G06F 12/0607 711/103 |
| 6,285,583 B1 * | 9/2001 | Cleveland | .............. | G11C 16/22 365/185.04 |
| 6,418,046 B1 * | 7/2002 | Naji | .................... | G11C 11/1657 365/158 |
| 6,563,743 B2 * | 5/2003 | Hanzawa | .................. | G11C 7/14 257/E27.005 |
| 6,738,279 B1 * | 5/2004 | Kablanian | .............. | G11C 5/025 365/230.03 |
| 6,854,084 B2 * | 2/2005 | Melanson | ............ | G06F 11/1064 714/773 |
| 7,783,936 B1 * | 8/2010 | Hall | ..................... | G06F 11/1008 714/701 |
| 2004/0066701 A1 * | 4/2004 | Kaiser | .................. | G11C 7/1012 365/233.1 |

(Continued)

OTHER PUBLICATIONS

U.S. Appl. No. 14/201,642, filed Mar. 7, 2014, First Named Inventor: Tadashi Miyakawa, Title: "Semiconductor Storage Device".

*Primary Examiner* — Ly D Pham
(74) *Attorney, Agent, or Firm* — Holtz, Holtz & Volek PC

(57) ABSTRACT

A memory device according to an embodiment includes a first memory cell array; a second memory cell array; and a multiplexer arranged between the first memory cell array and the second memory cell array, the multiplexer controlling the first memory cell array and the second memory cell array.

17 Claims, 23 Drawing Sheets

(56) References Cited

U.S. PATENT DOCUMENTS

| | | | |
|---|---|---|---|
| 2009/0003047 A1* | 1/2009 | Toda | G11C 13/00 365/163 |
| 2010/0265750 A1* | 10/2010 | Yan | G11C 8/12 365/51 |
| 2011/0305068 A1 | 12/2011 | Kitagawa et al. | |
| 2012/0218805 A1 | 8/2012 | Kim et al. | |

* cited by examiner

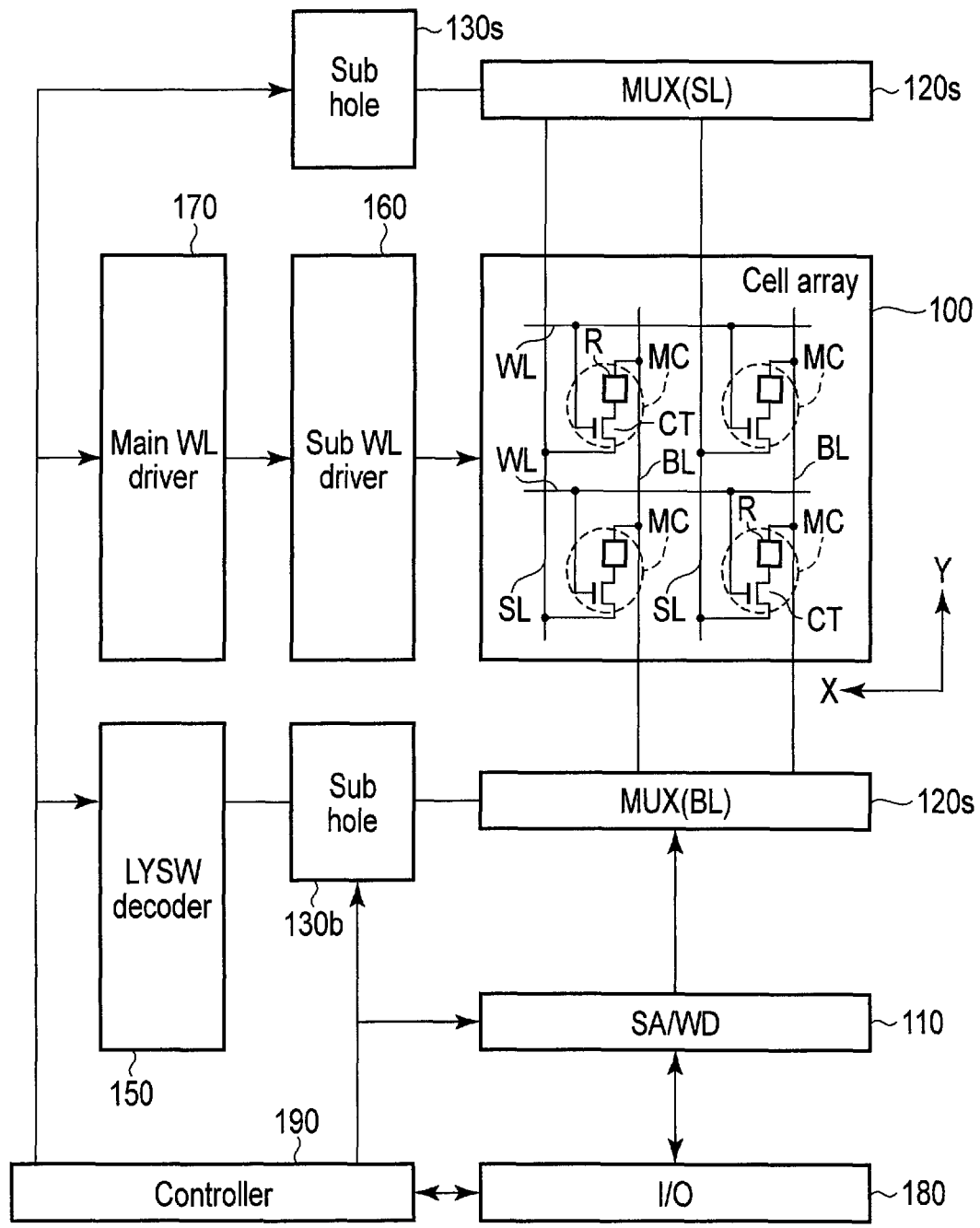
F I G. 1

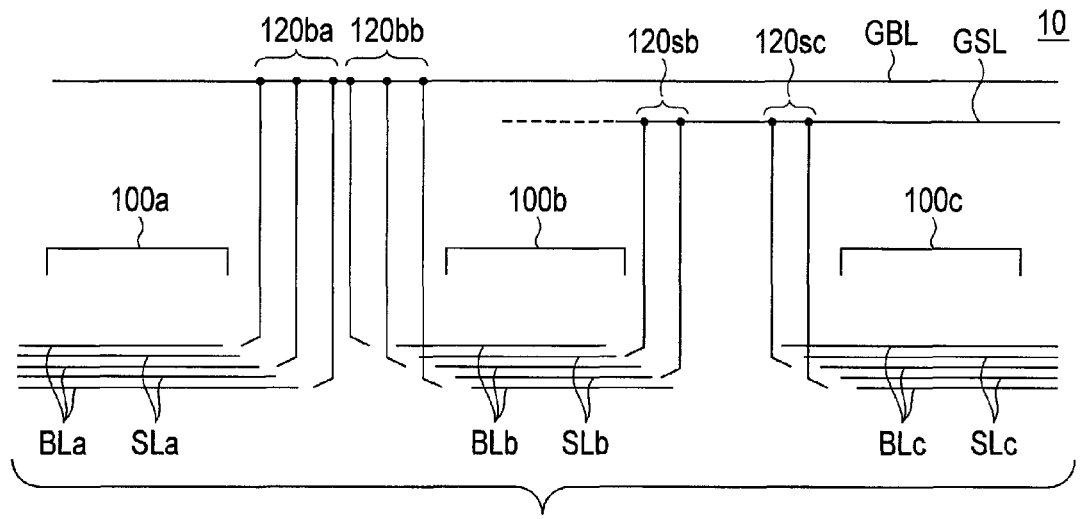
F I G. 5A
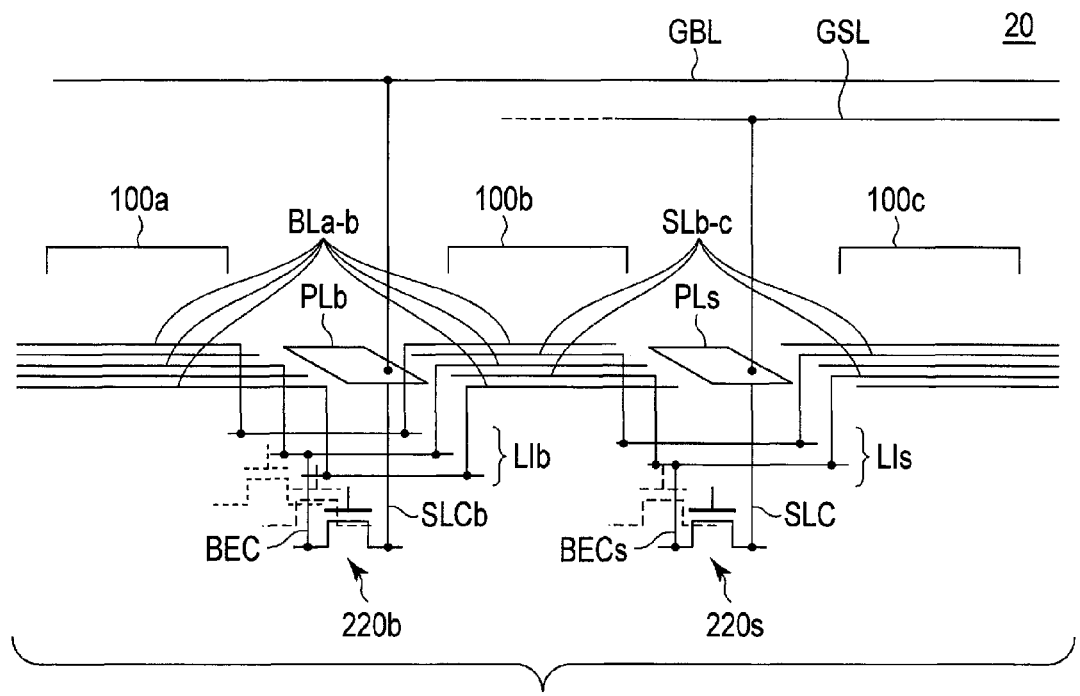
F I G. 5B

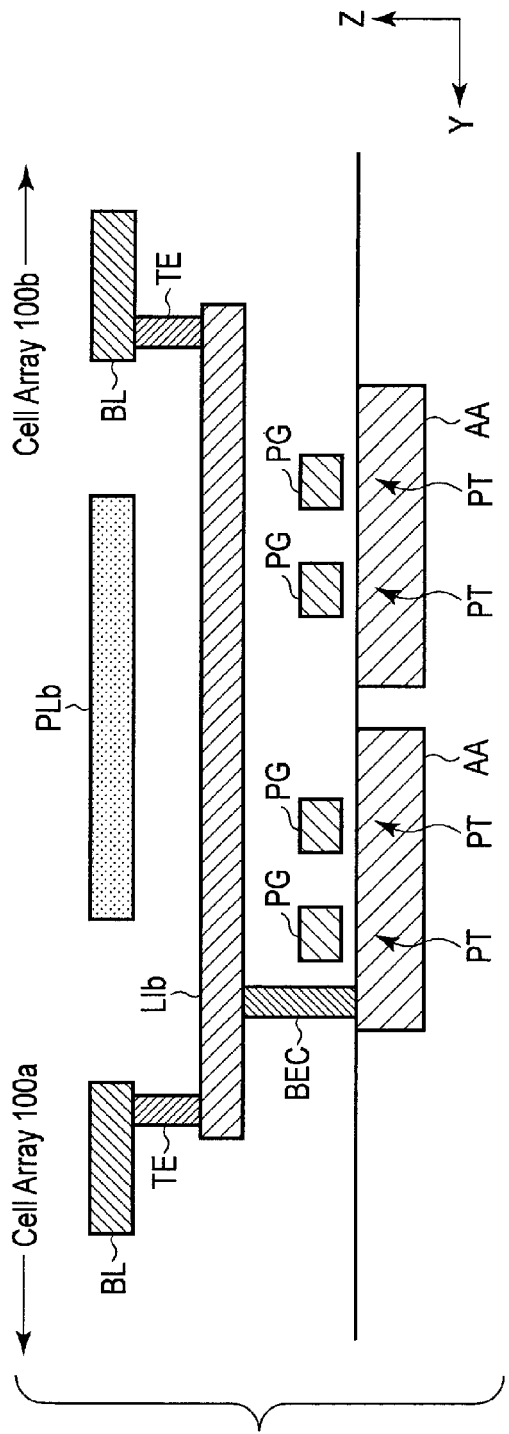
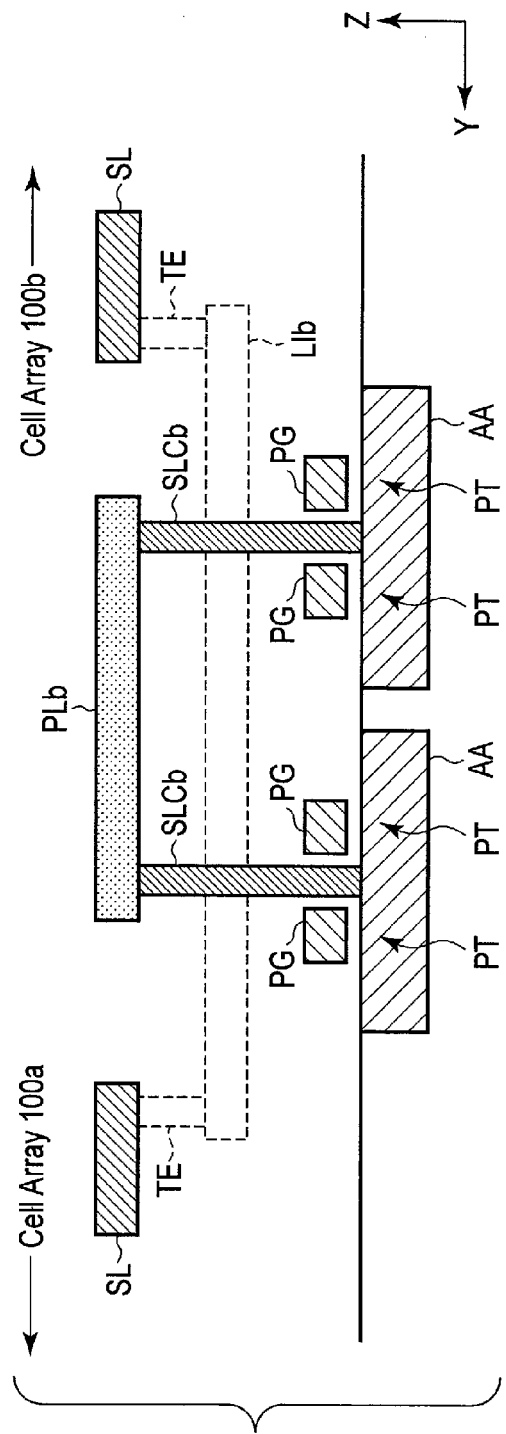
F I G. 10A
F I G. 10B

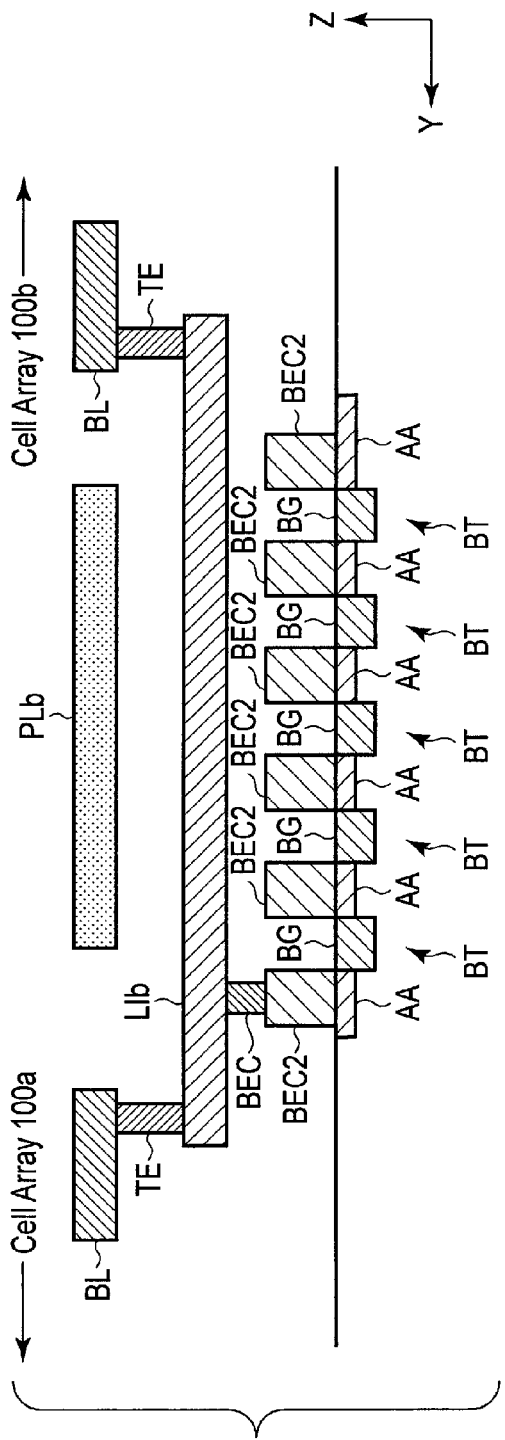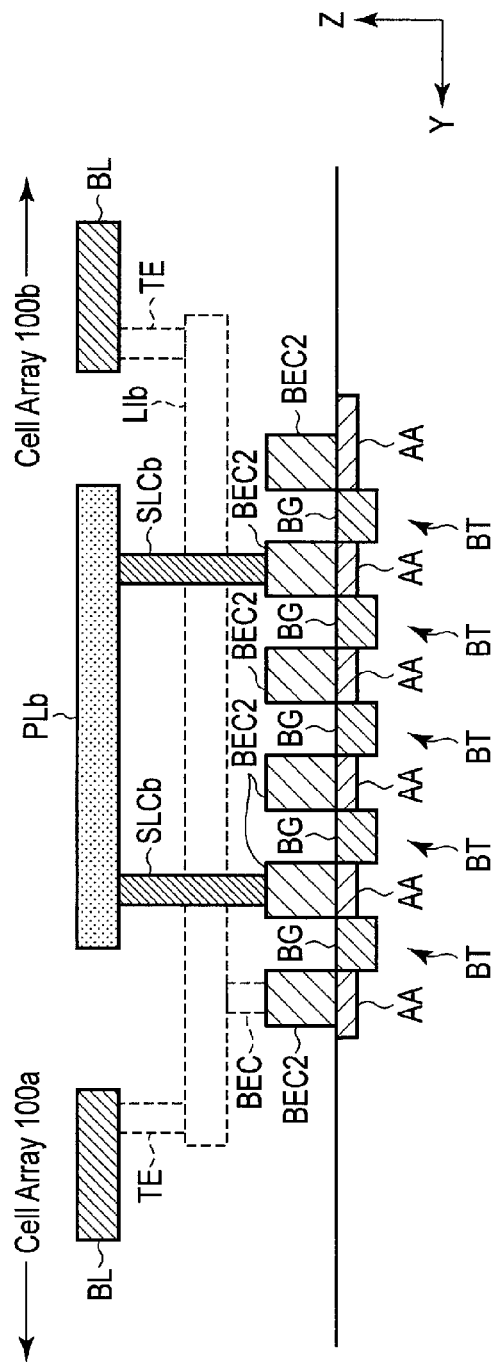
F I G. 14A
F I G. 14B

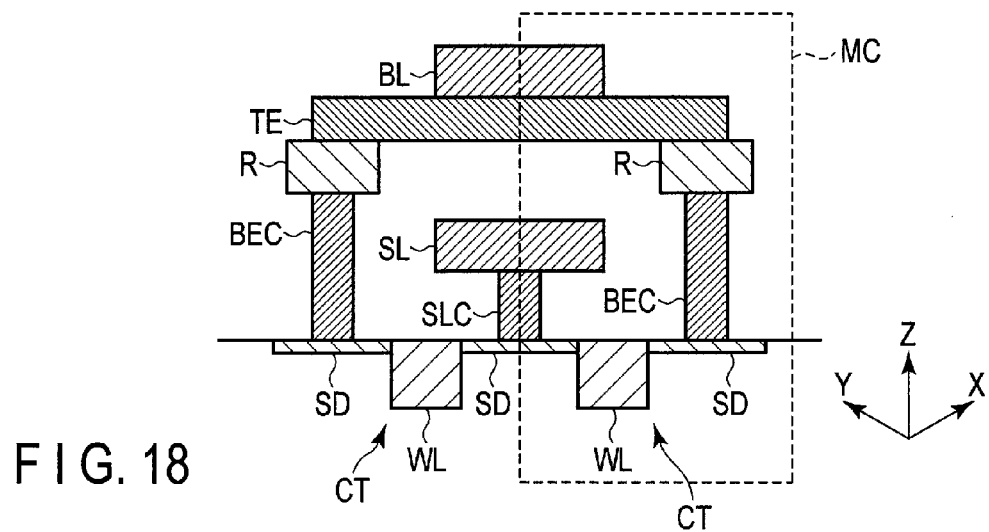
F I G. 18
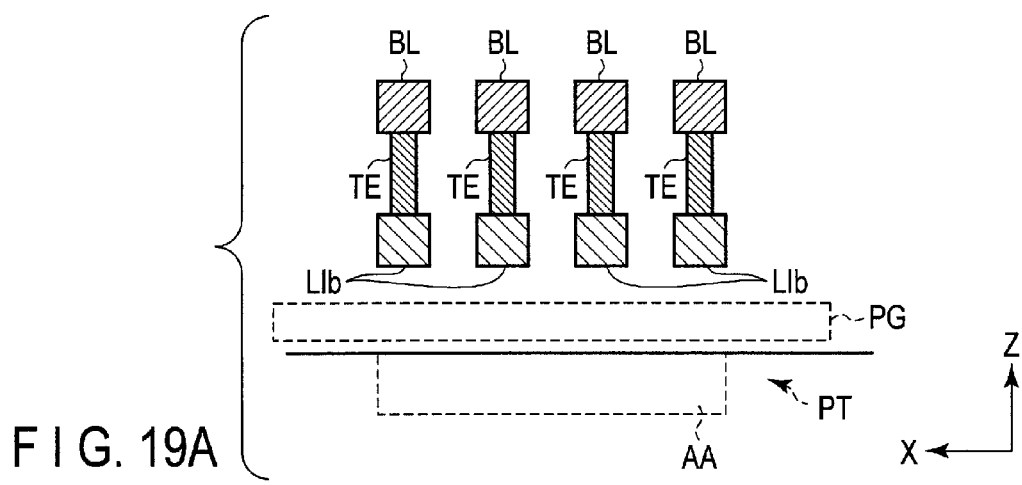
F I G. 19A
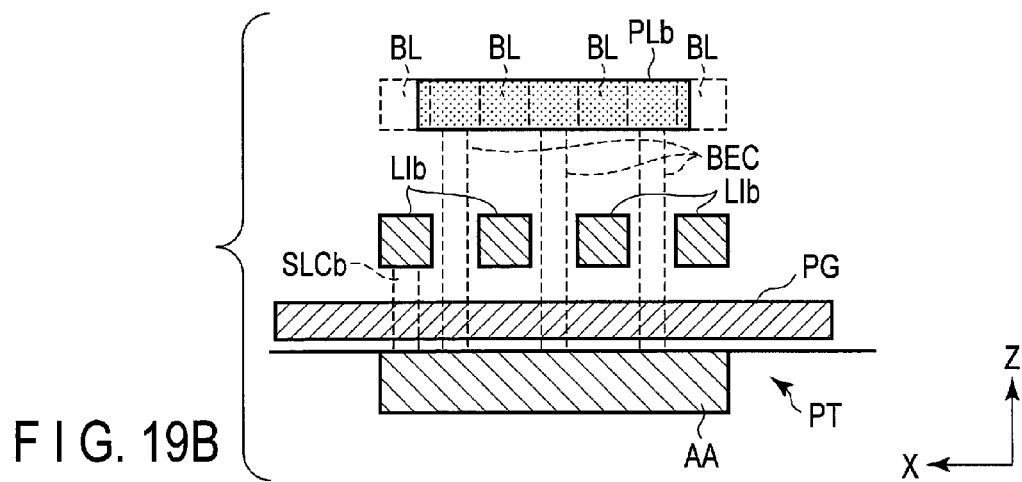
F I G. 19B

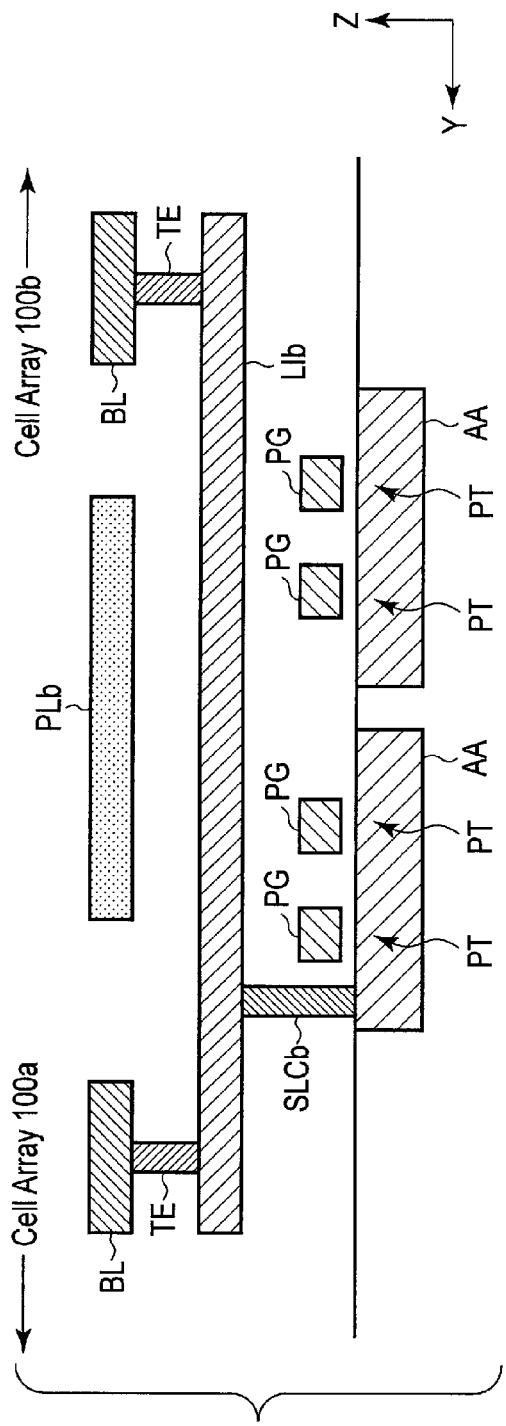
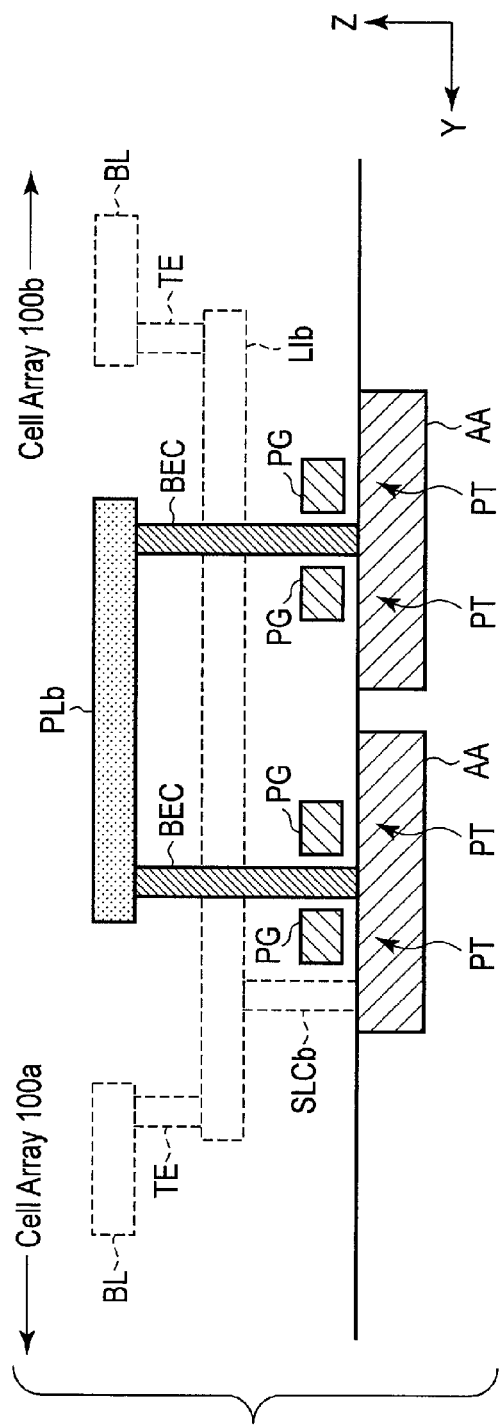
F I G. 20A
F I G. 20B

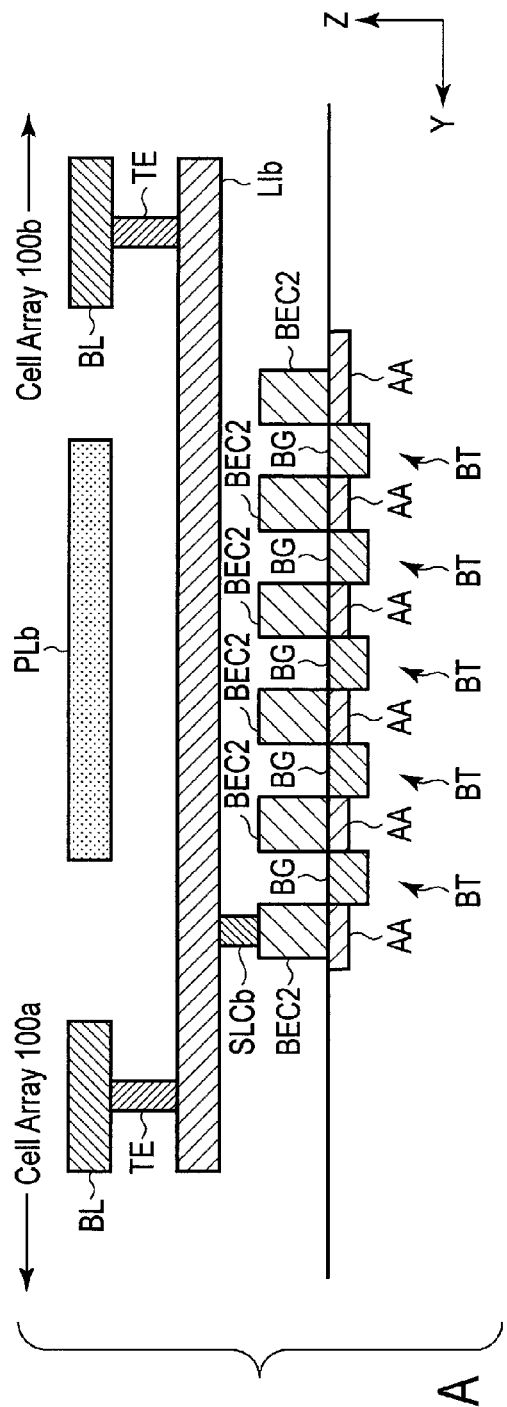
F I G. 24A
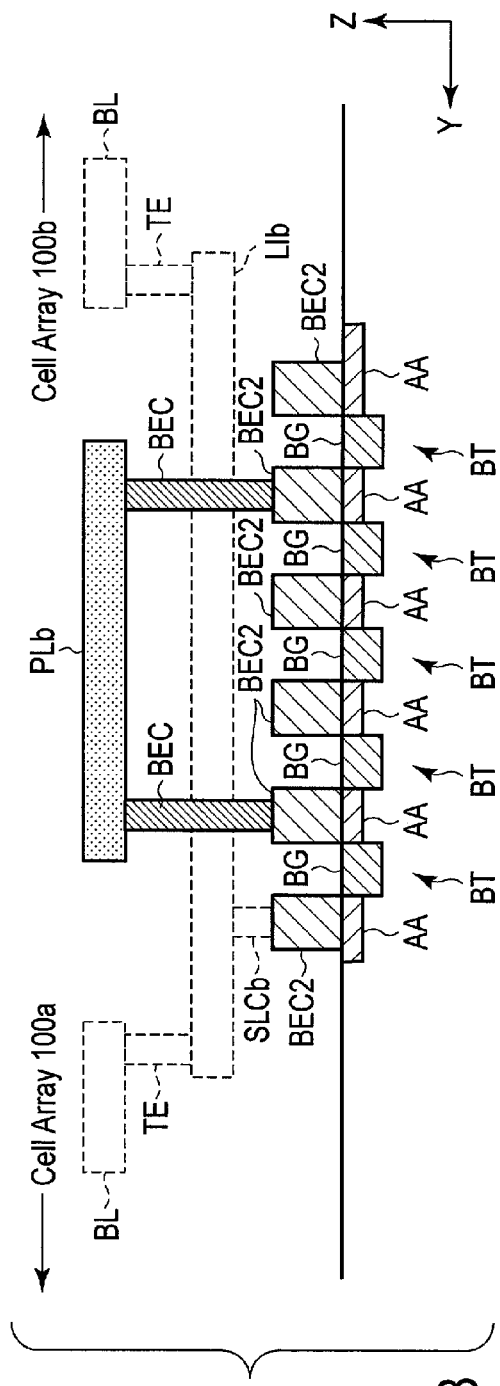
F I G. 24B

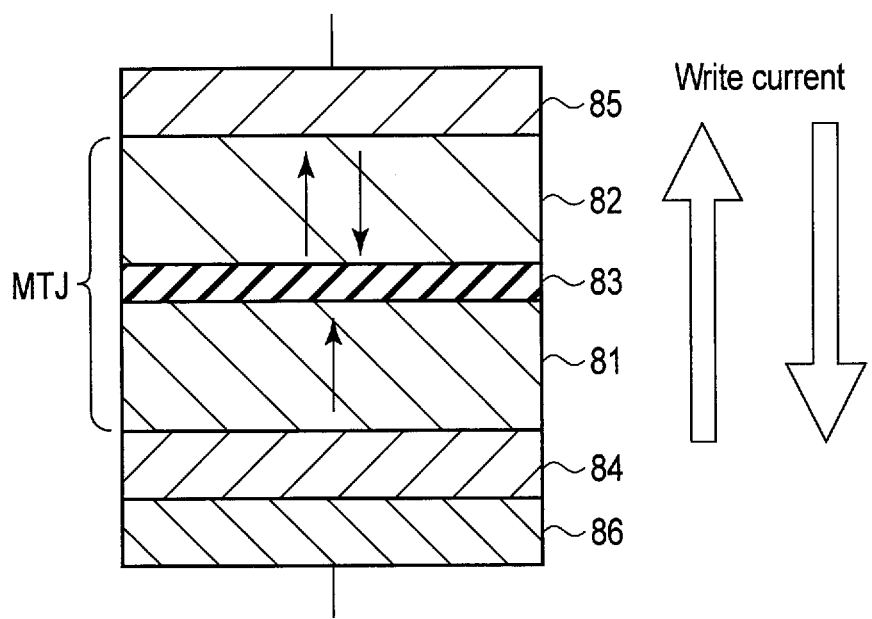
F I G. 25

MEMORY DEVICE

CROSS REFERENCE TO RELATED APPLICATIONS

This application claims the benefit of U.S. Provisional Application No. 62/044,698, filed Sep. 2, 2014, the entire contents of which are incorporated herein by reference.

FIELD

Embodiments described herein relate generally to a memory device.

BACKGROUND

A resistance change memory device using a resistance change element is known as a memory device.

BRIEF DESCRIPTION OF THE DRAWINGS

FIG. 1 shows an example of the circuit configuration of a memory device according to the first embodiment;

FIG. 5A shows the wiring structure of the memory device according to the first embodiment;

FIG. 5B shows the wiring structure of another memory device according to the first embodiment;

FIG. 10A shows a section taken along a line A1-A1' in FIG. 6A;

FIG. 10B shows a section taken along a line A2-A2' in FIG. 6A;

FIG. 14A shows a section taken along a line A1-A1' in FIG. 11A;

FIG. 14B shows a section taken along a line A2-A2' in FIG. 11A;

FIG. 18 shows a section of a memory cell of the memory device according to the second embodiment;

FIG. 19A shows a section taken along a line B1-B1' in FIG. 16;

FIG. 19B shows a section taken along a line B2-B2' in FIG. 16;

FIG. 20A shows a section taken along a line A1-A1' in FIG. 16;

FIG. 20B shows a section taken along a line A2-A2' in FIG. 16;

FIG. 24A shows a section taken along a line A1-A1' in FIG. 21;

FIG. 24B shows a section taken along a line A2-A2' in FIG. 21; and

FIG. 25 schematically shows a configuration example of a memory element of a memory device according to an embodiment.

DETAILED DESCRIPTION

Figure 2:
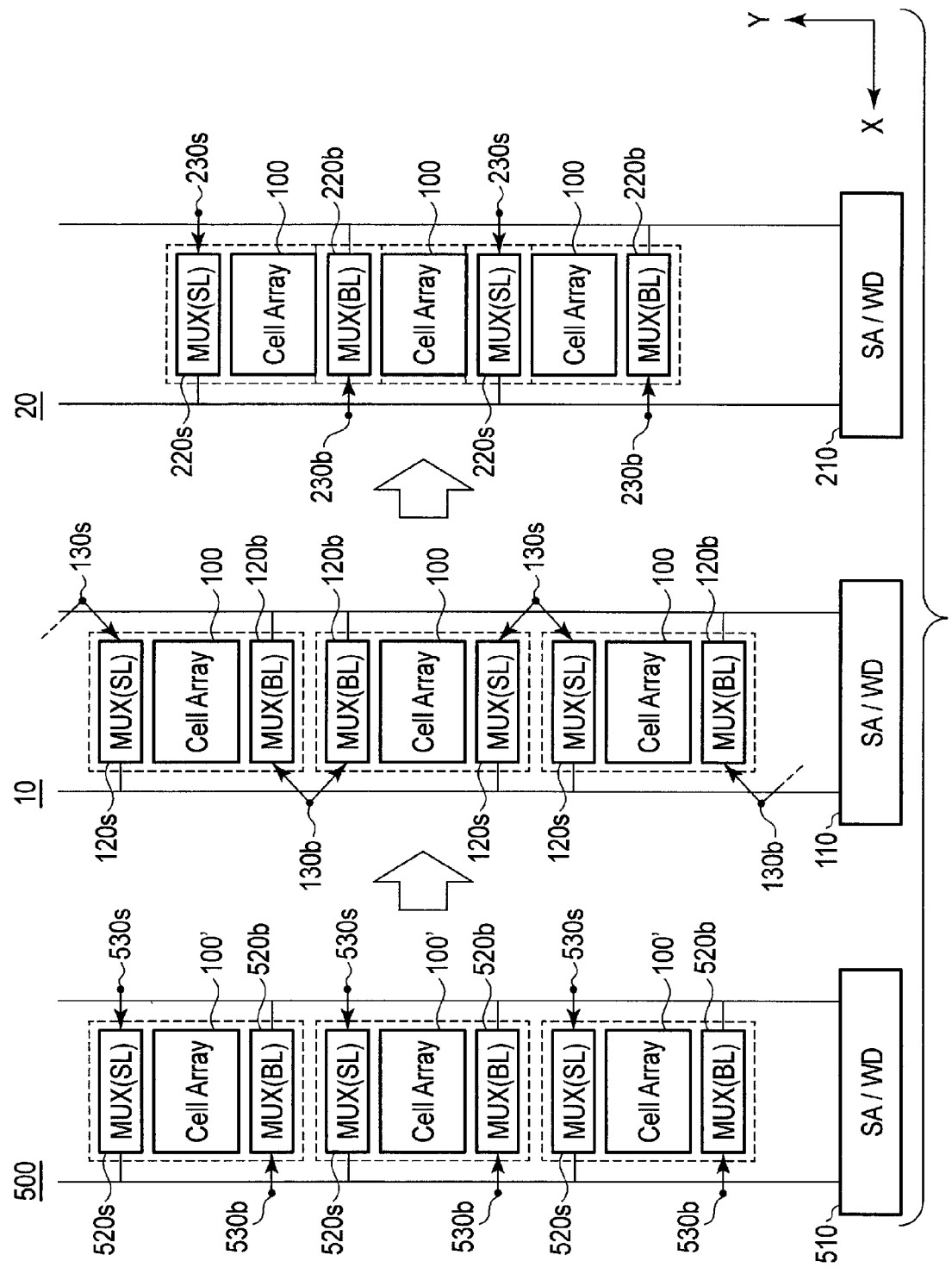
FIG. 2 shows examples of the layouts of memory devices.

A memory device such as a resistance change memory device includes a plurality of cell arrays each including a plurality of memory cells. Each memory cell is connected to a wire. A multiplexer switches the wires of the memory cells. A driver drives the multiplexer. For example, the multiplexer and driver are provided for each cell array.

As the number of memory cells increases, the installation areas of the multiplexer and driver are increasing in the memory device.

In embodiments to be described below, the installation area of at least one of the multiplexer and driver can be reduced. That is, a memory device of an embodiment includes a first memory cell array; a second memory cell array; and a multiplexer arranged between the first memory cell array and the second memory cell array, the multiplexer controlling the first memory cell array and the second memory cell array.

The embodiments will be explained below with reference to the accompanying drawings. In these drawings, the same reference numerals denote the same parts. Also, a repetitive explanation will be made as needed.

In the following explanation, "connection" means a physical connection, and includes a direct connection and an indirect connection made via another element. "Electrical connection" means an electrical conduction state, and includes a direct connection and an indirect connection made via another element.

First Embodiment

A memory device according to this embodiment will be explained below. The memory device according to this embodiment is, e.g., a resistance change memory device in which a memory cell includes a resistance change element.

(1) Outline of Resistance Change Memory Devices

An outline of resistance change memory devices 10 and 20 according to this embodiment will be explained with reference to FIGS. 1, 2, 3, 4, 5A, and 5B.

[Example of Circuit Configuration of Resistance Change Memory Device]

FIG. 1 shows an example of the circuit configuration of the memory device according to the first embodiment. FIG. 1 shows the circuit configuration of the resistance change memory device 10, and the resistance change memory device 20 has the same circuit configuration.

As shown in FIG. 1, the resistance change memory device 10 includes a cell array 100, a sense amplifier and write driver (SA/WD) 110, multiplexers 120b and 120s, drivers (sub holes) 130b and 130s, a LYSW decoder 150, a sub word line driver 160, a main word line driver 170, an input/output circuit 180, and a controller 190. The resistance change memory device 10 includes at least one set of the cell array 100, the multiplexers 120b and 120s, and the drivers 130b and 130s. However, the resistance change memory device 10 may also include a plurality of sets of these circuits.

The cell array 100 includes a plurality of memory cells MC. The plurality of memory cells MC are arranged in a matrix in the cell array 100. A plurality of memory cells MC arranged on each line in the X direction (row direction) are connected to a common word line WL of a plurality of word lines WL running in the X direction in the cell array 100. A plurality of memory cells MC arranged on each line in the Y direction (column direction) are connected to a common pair of a bit line BL and source line SL of a plurality of bit lines BL running in the Y direction in the cell array 100 and a plurality of source lines SL making pairs with the bit lines BL.

The memory cell MC includes a resistance change element R as a memory element, and a cell transistor CT. The resistance change element R is so configured as to be able to store data in accordance with a change in resistance state. The cell transistor CT is connected in series with the resistance change element R, and is so configured as to control the supply and stop of an electric current to the resistance change element R. One end of the resistance change element R of the memory cell MC is connected to one of the bit line BL and source line SL making a pair, e.g., the bit line BL. Further, one end of the current path of the cell transistor CT of the memory cell MC is connected to the other one of the bit line BL and source line SL making a pair, e.g., the source line SL. Further, the gate of the cell transistor CT of the memory cell MC is connected to the word line WL. However, there is no difference between the gate and word line WL due to the structure of the cell transistor CT, so the gate of the cell transistor CT is practically the same as the word line WL.

The SA/WD 110 supplies an electric current to a specific memory cell MC through the bit line BL and source line SL, thereby performing write and read with respect to the memory cell MC (the resistance change element R). More specifically, the write driver of the SA/WD 110 performs write to the memory cell MC. The sense amplifier of the SA/WD 110 performs read from the memory cell MC.

The multiplexers 120b and 120s function as a switch for electrically connecting a specific memory cell MC of the plurality of memory cells MC to the SA/WD 110. The multiplexer 120b is connected to a plurality of bit lines BL running from the cell array 100 to one side in the Y direction. The multiplexer 120s is connected to a plurality of source lines SL running from the cell array 100 to the other side in the Y direction. The multiplexers 120b and 120s are so configured as to electrically connect one bit line BL and one source line SL to the SA/WD 110 by ON and OFF operations. The configuration of the multiplexers 120b and 120s will be described later.

The drivers 130b and 130s generate control signals for the multiplexers 120b and 120s, and supply the generated signals to the multiplexers 120b and 120s.

The LYSW decoder 150 controls the multiplexers 120b and 120s based on an address signal.

The sub word line driver 160 and main word line driver 170 are connected to a plurality of word lines WL running from the cell array 100. The sub word line driver 160 and main word line driver 170 have a hierarchical structure, and supply a signal to the word line WL to which the memory cell MC as an operation target is connected.

The input/output circuit 180 transmits various externally received signals to the controller 190 and SA/WD 110, and transmits various kinds of information from the controller 190 and SA/WD 110 to an external device.

The controller 190 is connected to the SA/WD 110, drivers 130b and 130s, LYSW decoder 150, main word line driver 170, and input/output circuit 180. In accordance with externally received signals from the input/output circuit 180, the controller 190 controls the SA/WD 110, drivers 130b and 130s, LYSW decoder 150, and main word line driver 170.

In the resistance change memory device 10, an arrangement including the cell array 100, multiplexers 120b and 120s, drivers 130b and 130s, and sub word line driver 160 is also called a core block.

[Layouts of Resistance Change Memory Devices]

FIG. 2 shows examples of the layouts of memory devices.

As shown in FIG. 2, a resistance change memory device 500 according to a comparative example includes a plurality of cell arrays 100' connected to an SA/WD 510. The SA/WD 510 performs operations such as write and read with respect to memory cells in the cell arrays 100'.

A multiplexer 520b is provided on one side of each cell array 100' in the Y direction (column direction), e.g., on the side of the SA/WD 510. The multiplexer 520b switches bit lines BL connected to memory cells, and connects a specific bit line BL to the SA/WD 510. A driver 530b is provided on one side of the multiplexer 520b in the X direction (row direction). A multiplexer 520s is provided on the other side of each cell array 100' in the Y direction, e.g., on the side opposite to the side of the SA/WD 510. The multiplexer 520s switches source lines SL connected to memory cells, and connects a specific source line SL to the SA/WD 510. A driver 530s is provided on one side of the multiplexer 520s in the X direction (row direction).

In the resistance change memory device 10 according to this embodiment, the plurality of multiplexers 120 have the common driver 130.

More specifically, in the resistance change memory device 10, the multiplexer 120b for switching the bit lines BL and the multiplexer 120s for switching the source lines SL are collectively arranged on one side of each cell array 100 with respect to the SA/WD 110. That is, the multiplexers 120b for controlling different cell arrays 100 are arranged to oppose each other between the cell arrays 100. One driver 130b controls the multiplexers 120b adjacent to each other. Further, the multiplexers 120s for controlling different cell arrays 100 are arranged to oppose each other between the cell arrays 100. One driver 130s controls the multiplexers 120s adjacent to each other.

In the resistance change memory device 20 according to this embodiment, a plurality of cell arrays 100 have a common multiplexer 220 and common driver 230.

More specifically, in the resistance change memory device 20, one multiplexer 220b is arranged between the cell arrays 100 arranged in the Y direction. The multiplexer 220b switches the bit lines BL of the two cell arrays 100. One driver 230b controls the multiplexer 220b. Also, one multiplexer 220s is arranged between the cell arrays 100 arranged in the Y direction. The multiplexer 220s switches the source lines SL of the two cell arrays 100. One driver 230s controls the multiplexer 220s.

[Sharing Examples of Multiplexers and Drivers]

Each of the above-mentioned multiplexers 120 and 220 includes, e.g., a plurality of transistors, and switches wires such as the bit lines BL and source lines SL by turning on and off these transistors. In this embodiment, each transistor is configured as, e.g., a buried gate transistor or planar transistor.

Figure 3:
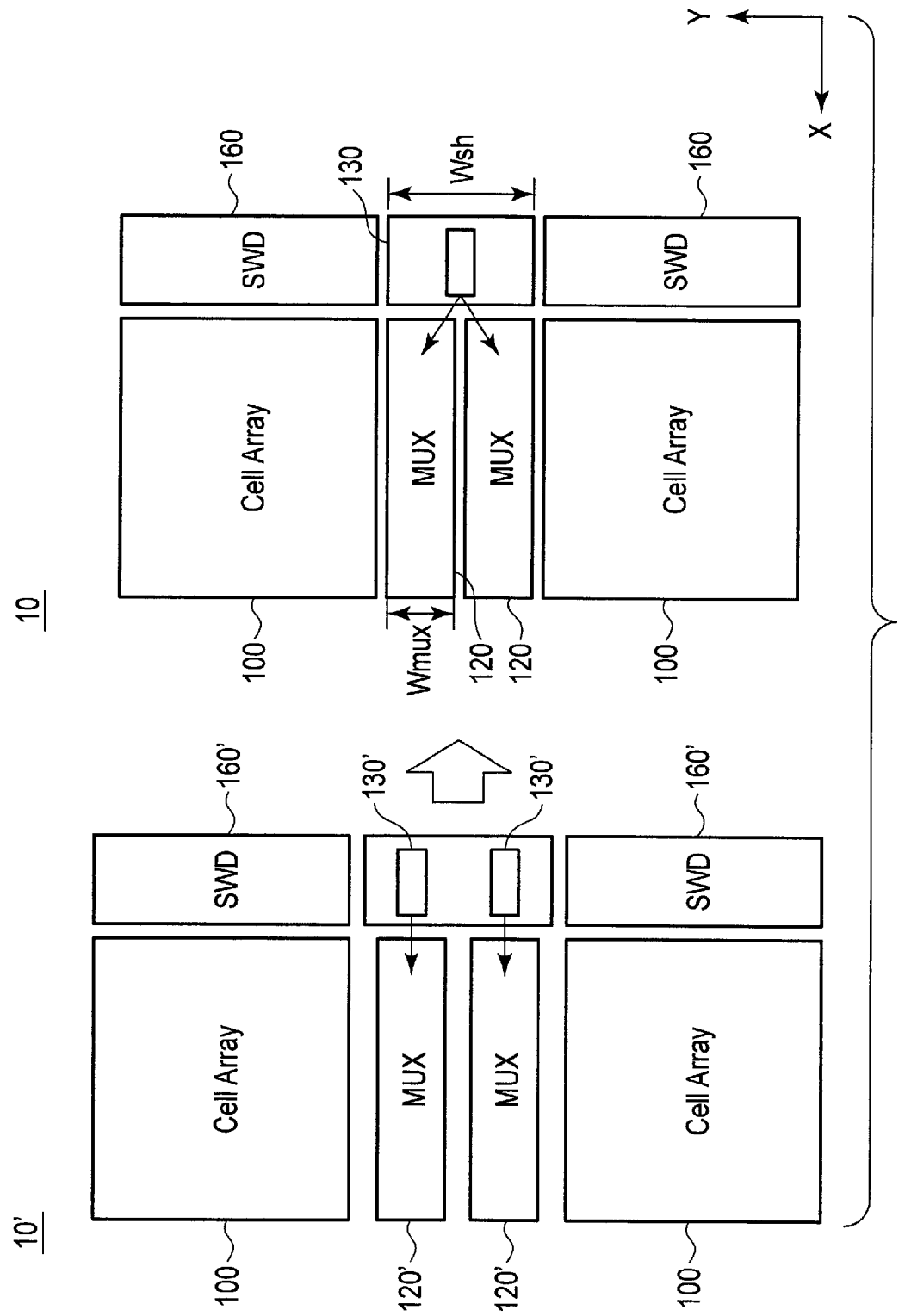
FIG. 3 shows an example of sharing of drivers shown in FIG. 2.

FIG. 3 shows an example of sharing of the drivers shown in FIG. 2. FIG. 3 shows core blocks (cell arrays 100, multiplexers 120 and 120', drivers 130 and 130', and sub word line drivers 160 and 160') of resistance change memory devices 10 and 10'.

A buried gate transistor can be made smaller than a planar transistor, and is suitably applied to, e.g., the above-mentioned resistance change memory device 10. The resistance change memory device 10' according to a comparative example shown in FIG. 3 includes two multiplexers 120' using, e.g., buried gate transistors, and two drivers 130' between the cell arrays 100. In the resistance change memory device 10 according to this embodiment shown in FIG. 3, one driver 130 controls two multiplexers 120. A width Wmux×2 of the two multiplexers 120 in the Y direction is smaller than, e.g., a width Wsh of one integrated driver 130 in the Y direction. By using one integrated driver 130, therefore, the whole width of the multiplexers 120 and driver 130 arranged between the cell arrays 100 can be reduced.

Figure 4:
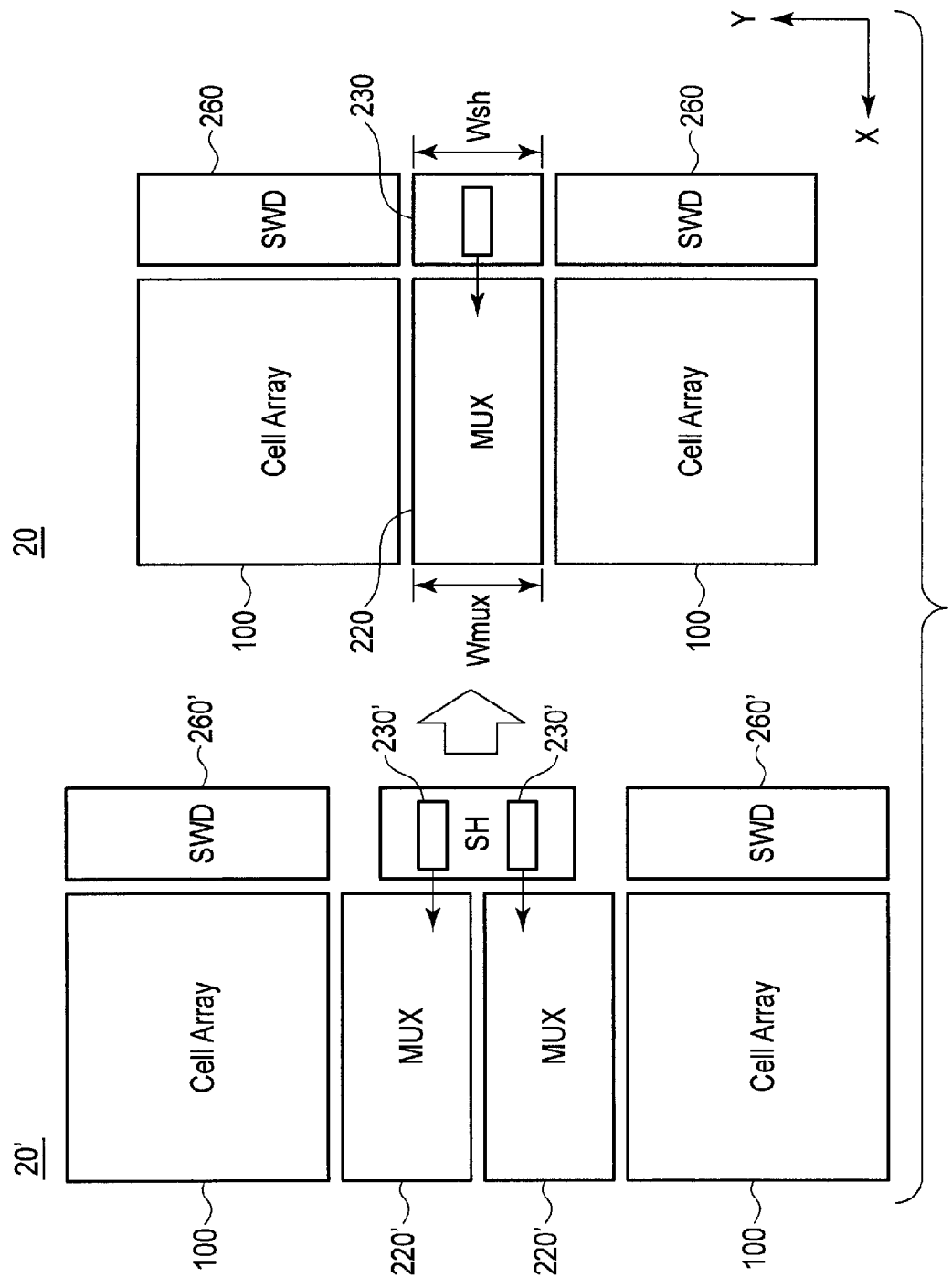
FIG. 4 shows an example of sharing of multiplexers shown in FIG. 2.

FIG. 4 shows an example of sharing of the multiplexers shown in FIG. 2. FIG. 4 shows core blocks (cell arrays 100, multiplexers 220 and 220', drivers 230 and 230', and sub word line drivers 260 and 260') of resistance change memory devices 20 and 20'.

A planar transistor is suitably applied to, e.g., the above-mentioned resistance change memory device 20. The resistance change memory device 20' according to a comparative example shown in FIG. 4 includes two multiplexers 220' using, e.g., planar transistors, and two drivers 230' between the cell arrays 100. In the resistance change memory device 20 according to this embodiment shown in FIG. 4, one multiplexer 220 controls the cell arrays 100 on the two sides, and one driver 230 controls the multiplexer 220. A width Wmux of one integrated multiplexer 220 in the Y direction is almost equal to a width Wsh of one integrated driver 130 in the Y direction. By thus using one integrated multiplexer 220, the whole width of the multiplexer 220 and driver 230 provided between the cell arrays 100 can be reduced.

Alternatively, the multiplexer 120 using planar transistors may also be applied to the resistance change memory device 10, and the multiplexer 220 using a buried gate transistor may also be applied to the resistance change memory device 20.

[Wiring Structures of Resistance Change Memory Devices]

FIG. 5A shows the wiring structure of the memory device according to the first embodiment. That is, FIG. 5A shows the resistance change memory device 10.

As shown in FIG. 5A, the resistance change memory device 10 shown in FIG. 2 includes a plurality of bit lines BL (BLa, BLb, and BLc) and a plurality of source lines SL (SLa, SLb, and SLc) in cell arrays 100 (100a, 100b, and 100c). The bit lines BL and source lines SL are provided in, e.g., the same layer. A global bit line GBL and global source line GSL are provided above the bit lines BL and source lines SL.

A multiplexer 120ba for electrically connecting one bit line BLa to the global bit line GBL and a multiplexer 120bb for electrically connecting one bit line BLb to the global bit line GBL are provided between the cell arrays 100a and 100b. A multiplexer 120sb for electrically connecting one source line SLb to the global source line GSL and a multiplexer 120sc for electrically connecting one source line SLc to the global source line GSL are provided between the cell arrays 100b and 100c.

FIG. 5B shows the wiring structure of the other memory device according to this embodiment. That is, FIG. 5B shows the resistance change memory device 20.

In the resistance change memory device 20 as shown in FIG. 5B, a plurality of bit lines BL and a plurality of source lines SL connect a plurality of cell arrays 100 (100a, 100b, and 100c). Since a transistor of the multiplexers 220 is provided for each of the plurality of bit lines BL and the plurality of source lines SL, memory cells included in the plurality of cell arrays 100 can be selected. The bit lines BL and source lines SL are formed at a pitch narrower than that of upper-layer wires such as a global bit line GBL and global source line GSL, and this narrow pitch is maintained even between the cell arrays 100. The multiplexer 220 must connect the bit lines BL and source lines SL provided at a narrow pitch, and the global bit line GBL and global source line GSL provided at a relatively wide pitch.

As described above, when the multiplexer 220 is shared by the plurality of cell arrays 100 as in the resistance change memory device 20, the configuration of the multiplexer 220 is a matter.

In the resistance change memory device 20, therefore, a plate interconnection PL arranged in the same layer as the bit lines BL and source lines SL is provided between the cell arrays 100. The plate interconnection PL relays the multiplexer 220 provided near the surface of the substrate to the global bit line GBL and global source line GSL. The plate interconnection PL has a width larger than that of the bit line BL and source line SL, and can extend a contact downward from an arbitrary portion. This contact extended downward is connected to the multiplexer 220 through the gap between the bit line BL and source line SL provided at a narrow pitch.

The bit lines BL and source lines SL connect the cell arrays 100 via connection lines LI arranged in a layer below the bit lines BL and source lines SL between the cell arrays 100. More specifically, a plate interconnection PLb, connection lines LIb, and a multiplexer 220b are arranged between the cell arrays 100a and 100b. The plate interconnection PLb is connected to the global bit line GBL. The connection lines LIb are connected to bit lines BLa-b extending from the cell arrays 100a and 100b. The multiplexer 220b is connected to the lines GBL, BL, and LIb. That is, the multiplexer 220b is connected to the global line GBL via a contact SLCb, and to the bit line BL via a contact BEC and the connection line LIb. A plate interconnection PLs, connection lines LIs, and a multiplexer 220s are arranged between the cell arrays 100b and 100c. The plate interconnection PLs is connected to the global source line GSL. The connection lines LIs are connected to source lines SLb-c extending from the cell arrays 100b and 100c. The multiplexer 220s is connected to the lines GSL, SL, and LIs. That is, the multiplexer 220s is connected to the global source line GSL via a contact SLC, and to the source line SL via a contact BECs and the connection line LIs.

The wiring structure shown in FIG. 5B will be explained in more detail below.

(2) Configuration Example of Resistance Change Memory Device

A configuration example of the resistance change memory device 20 according to this embodiment will be explained with reference to FIGS. 6A, 6B, 7, 8, 9A, 9B, 10A, and 10B. FIGS. 6A, 6B, 7, 8, 9A, 9B, 10A, and 10B illustrate a wiring structure around the multiplexer 220b, which is connected to the bit lines BLa-b (to be also simply referred to as bit lines BL hereinafter) as local lines (first local lines) and the global bit line GBL as a global line.

[Multiplexer and Transistor]

Figure 6A:
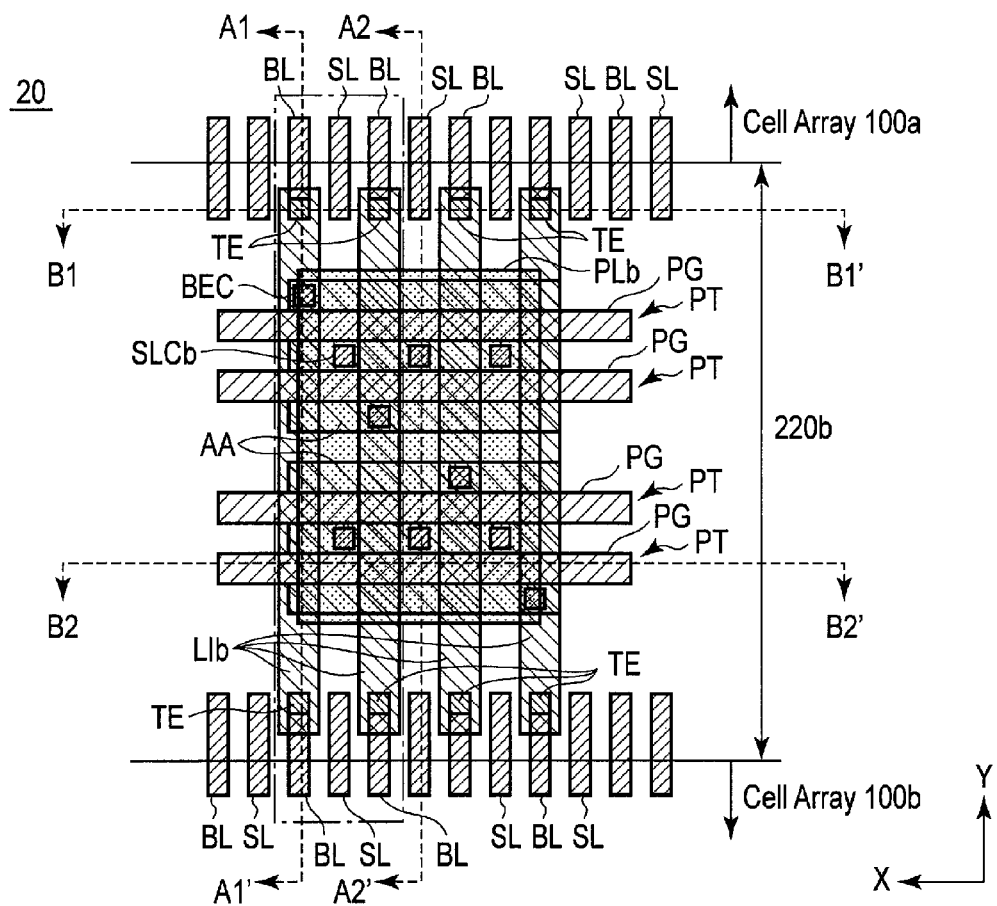
FIG. 6A shows the upper surface of the multiplexer of the memory device according to the first embodiment.

FIG. 6A shows the upper surface of the multiplexer of the memory device according to this embodiment.

As shown in FIG. 6A, the multiplexer 220b is arranged between the cell array 100a as a first cell array and the cell array 100b as a second cell array. The cell arrays 100a and 100b are arranged on the two sides of the multiplexer 220b in the Y direction. The bit lines BL and source lines SL run in the Y direction from the cell arrays 100a and 100b. The bit lines BL extending from the cell array 100a are connected to the bit lines BL extending from the cell array 100b via the connection lines LIb as local lines (second local lines). The connection lines LIb may also be regarded as portions of the bit lines BLa-b connecting the cell arrays 100a and 100b. That is, both the connection line LIb and bit line BLa-b may also be regarded as one local line.

The global bit line GBL (not shown) runs in the Y direction above the bit lines BL, connection lines LIb, and source lines SL. A plurality of bit lines BL are connected to the global bit line GBL via the multiplexer 220b. The number of bit lines BL connected to one global bit line GBL is, e.g., 8, 16, 32, .... The global bit line GBL electrically connects one bit line BL selected from the plurality of bit lines BL by the multiplexer 220b to the SA/WD 210 via the global bit line GBL. Consequently, the SA/WD 210 performs, e.g., a write or read operation on a specific memory cell.

The bit lines BL and source lines SL are formed at a pitch narrower than that of, e.g., the global bit lines GBL. This narrow pitch herein mentioned is, e.g., the pitch of the lithography limit. The pitch of the lithography limit is, e.g., a pitch of about 50 nm to 60 nm with respect to a line width of 30 nm or less. It is also possible to obtain lines having a pitch narrower than the lithography-limit pitch by forming the lines by using, e.g., a sidewall transfer technique. More specifically, it is possible to obtain, e.g., a narrow pitch about half the lithography-limit pitch by using the sidewall transfer technique. Between the cell arrays 100a and 100b, the connection lines LIb maintain at least the pitch of the bit lines BL. The pitch of the connection lines LIb is narrower than, e.g., that of the global bit lines GBL.

Figure 6B:
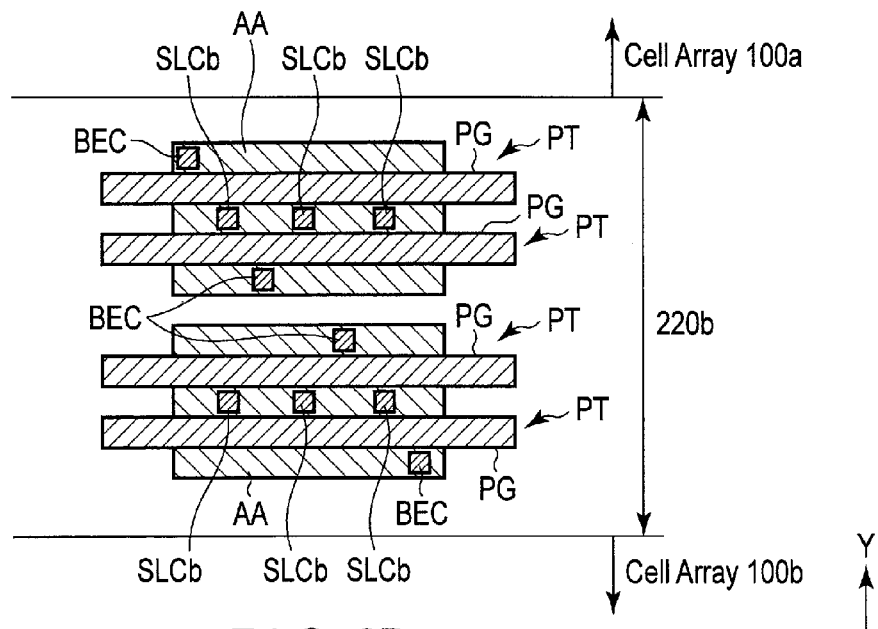
FIG. 6B shows the lower structure of the multiplexer of the memory device according to the first embodiment.
Figure 7:
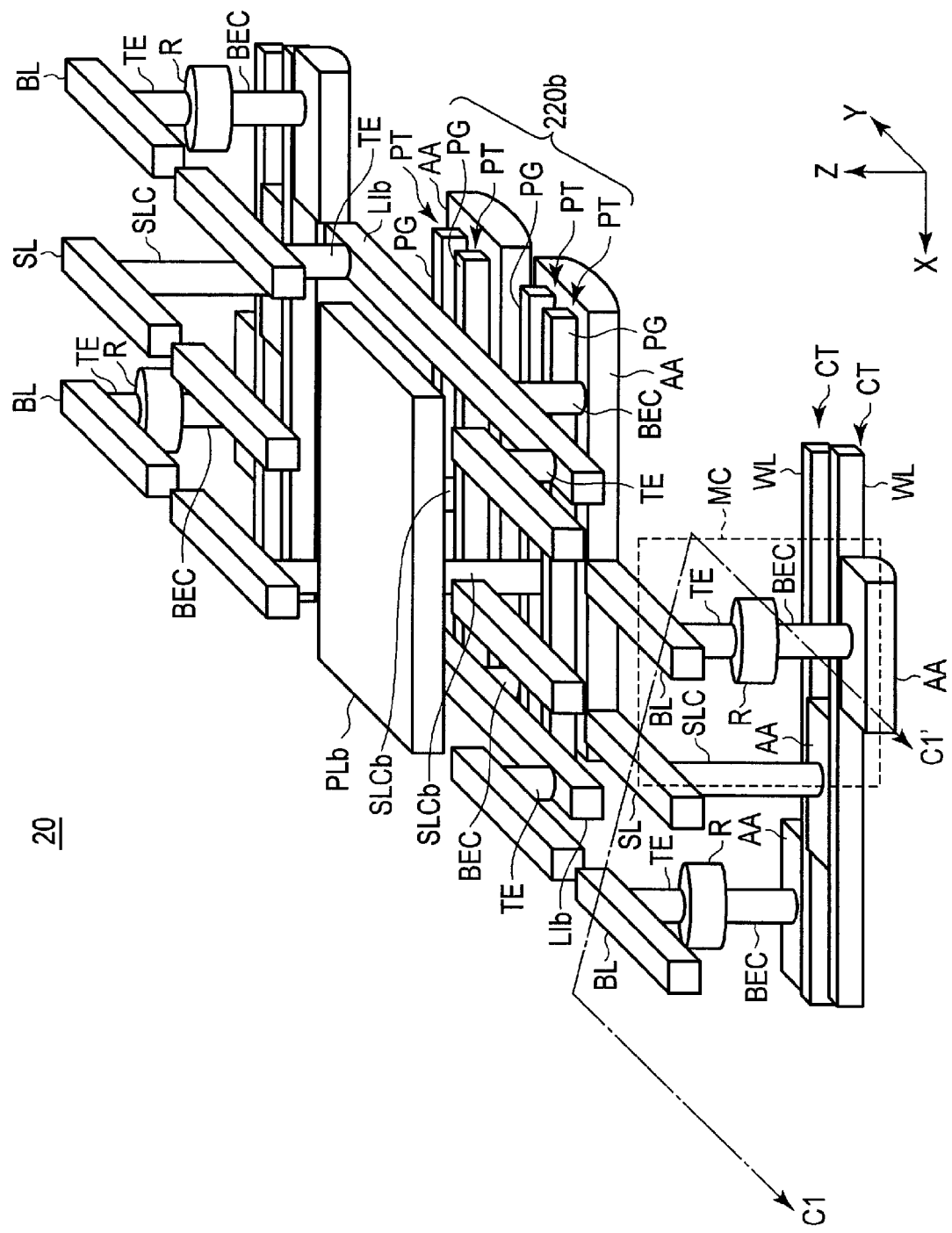
FIG. 7 shows the three-dimensional structure of the multiplexer of the memory device according to the first embodiment.
Figure 9A:
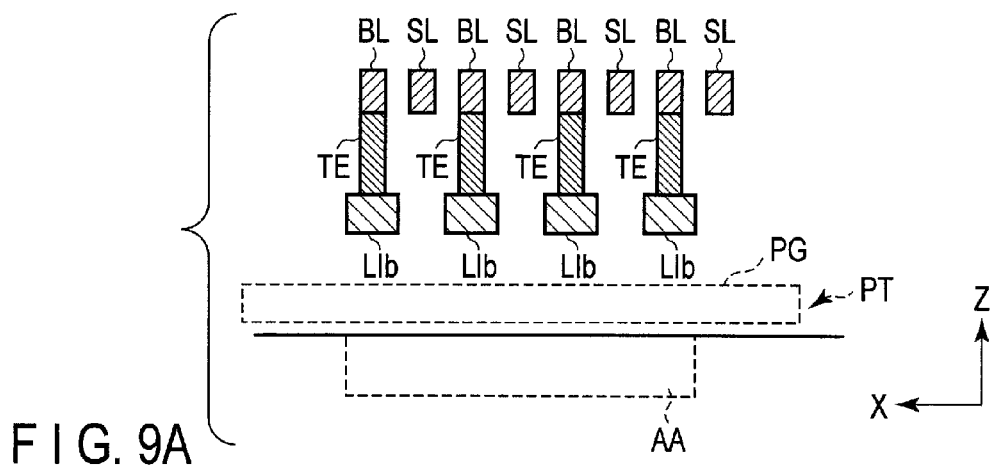
FIG. 9A shows a section taken along a line B1-B1' in FIG. 6A.
Figure 9B:
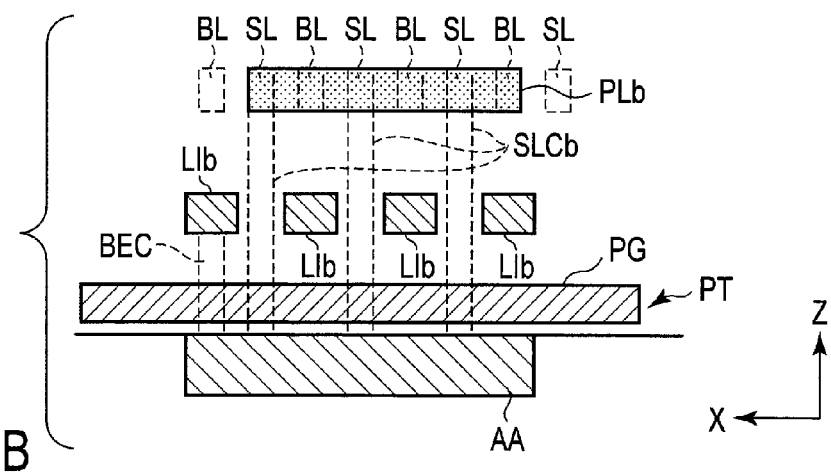
FIG. 9B shows a section taken along a line B2-B2' in FIG. 6A.

FIG. 6B shows the lower structure of the multiplexer of the memory device according to this embodiment. FIG. 7 shows the three-dimensional structure of the multiplexer of the memory device according to this embodiment. FIG. 7 is a perspective view including a portion indicated by the one-dot dashed lines in FIG. 6A and the memory cell structure. FIG. 7 omits the structure between the memory cell and multiplexer 220b. Further, in FIG. 7, for the purpose of convenience, the same line widths of the connection lines LIb as the line widths of the bit lines BL, are illustrated. In the actual configuration, however, the line widths of the connection lines LIb may be larger than the line widths of the bit lines BL as illustrated in FIGS. 6A, 9A, and 9B, or may be smaller than the line widths of the bit lines BL.

As shown in FIG. 6B and FIG. 7, the multiplexer 220b includes a plurality of transistors PT. Each transistor PT is, e.g., a planar transistor having a gate PG formed on the substrate. The planar transistor is a transistor used in a peripheral region outside the cell array 100 and the like of the resistance change memory device 20.

The gate PG extends in, e.g., the X direction on the substrate. A diffusion layer AA is formed in a portion of the substrate below the gate PG. The diffusion layer AA includes source/drain regions on the both sides of the gate PG. The diffusion layer AA is divided into two or more portions in, e.g., the X direction. The contact SLCb as a first contact is provided on the source/drain region of the diffusion layer AA on one side of the gate PG. The contact BEC as a second contact is provided on the source/drain region of the diffusion layer AA on the other side of the gate PG.

As shown in FIG. 6A and FIG. 6B, the contacts SLCb are provided at positions overlapping (extension lines of) the source lines SL when viewed from above, and are connected directly or indirectly to the global bit line GBL above the contacts SLCb. The contacts BEC are provided at positions overlapping the bit lines BL and connection lines LIb when viewed from above, and are connected directly or indirectly to the bit lines BL above the contacts BEC. In the aforementioned description, "above" is an upper portion in the Z direction shown in, e.g., FIG. 7.

Accordingly, one end of the current path of the transistor PT is connected to the global bit line GBL via the contact SLCb. The other end of the current path of the transistor PT is connected to the bit line BL via the contact BEC.

[Memory Cell]

Figure 8:
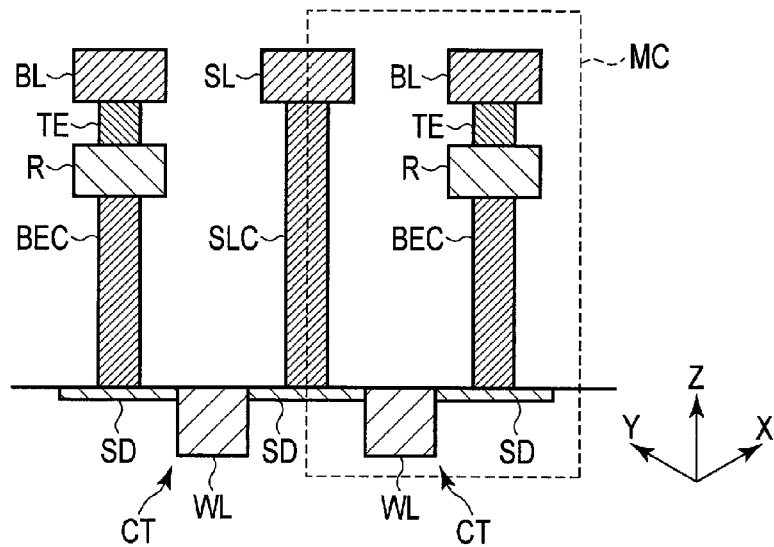
FIG. 8 shows a section of a memory cell of the memory device according to the first embodiment.

FIG. 8 shows a section of the memory cell of the memory device according to this embodiment. FIG. 8 shows a section taken along a line C1-C1' in FIG. 7.

The cell arrays 100a and 100b each include a plurality of memory cells MC shown in FIGS. 7 and 8. The memory cell MC includes the resistance change element R and cell transistor CT.

The resistance change element R is so configured as to be able to store data in accordance with a change in resistance state. The resistance change element R is configured such that data is written to or read from it when various electric currents are supplied from the SA/WD 210 through the bit line BL or source line SL. One end of the resistance change element R is connected to the bit line BL via a contact TE. The other end of the resistance change element R is connected to a source/drain region SD provided in the substrate via the contact BEC. The contact TE functions as the upper electrode of the resistance change element R. The contact BEC functions as the lower electrode of the resistance change element R.

The cell transistor CT includes the word line (gate) WL buried in the substrate, and the pair of source/drain regions SD sandwiching the word line WL. Thus, the cell transistor CT is configured as, e.g., a buried gate transistor having a gate buried in the substrate. The buried gate transistor is, e.g., a transistor used in a cell region including the cell arrays 100 and the like of the resistance change memory device 20. The word line WL runs in the X direction. As described above, one of the source/drain regions SD sandwiching the word line WL is connected to the contact BEC of the resistance change element R. The other one of the source/drain regions SD sandwiching the word line WL is connected to the contact SLC. The contact SLC is connected to the source line SL. The source line SL is provided in, e.g., the same layer as that of the bit line BL. The contact SLC is a contact provided at a position overlapping the source line SL when viewed from above, and is connected directly or indirectly to the source line SL above the contact SLC in the Z direction.

In this arrangement, the resistance change element R and cell transistor CT are connected in series, thereby forming a current path including the bit line BL, resistance change element R, cell transistor CT, and source line SL. When a specific signal is supplied to the word line WL of the cell transistor CT, the cell transistor CT controls the supply and stop of an electric current to the resistance change element R. Current supply from the bit line BL or source line SL is started when the cell transistor CT is turned on, and stopped when the cell transistor CT is turned off.

The source line SL and contact SLC are further connected to another cell transistor CT which is connected to another resistance change element R. That is, the resistance change element R and cell transistor CT form one set, and two sets of the resistance change elements R and cell transistors CT share the source line SL, the contact SLC, and the source/drain regions SD provided below the contact SLC. As shown in FIG. 7, the resistance change elements R making a pair are arranged obliquely to both the bit line BL/source line SL and the word line WL intersecting each other in the X and Y directions. A plurality of resistance change elements R making pairs are arranged in the X direction and connected to a common word line WL.

[Plate Interconnection and Connection Line]

FIG. 9A shows a section taken along a line B1-B1' in FIG. 6A. FIG. 9B shows a section taken along a line B2-B2' in FIG. 6A. FIG. 10A shows a section taken along a line A1-A1' in FIG. 6A. FIG. 10B shows a section taken along a line A2-A2' in FIG. 6A.

As shown in FIG. 9B, the plate interconnection PLb is provided in the same layer as that of the bit lines BL and source lines SL, also called, e.g., an M0 layer level, above the transistor PT of the multiplexer 220b. The width of the plate interconnection PLb in the X direction is larger than at least the width of the bit line BL and source line SL in the X direction, and the plate interconnection PLb is provided across, e.g., a plurality of bit lines BL and a plurality of source lines SL. As shown in FIGS. 10A and 10B, the width of the plate interconnection PLb in the Y direction is larger than at least the width of the gate PG of the transistor PT in the Y direction, and the plate interconnection PLb is provided across, e.g., a plurality of gates PG. The plate interconnection PLb is connected to the global bit line GBL in the upper layer (also called, e.g., an M1 layer level) via a contact or the like (not shown).

As shown in FIG. 10A, the connection line LIb is provided in a layer different from that of the bit lines BL and source lines SL. More specifically, the connection line LIb is provided in, e.g., the same layer as that of the resistance change element R of the memory cell MC, which is a layer below the bit lines BL and source lines SL. The bit line BL is connected to the connection line LIb via the contact TE, and the connection line LIb is connected to the source/drain region of the diffusion layer AA of the transistor PT via the contact BEC. The connection line LIb connects the bit line BL extending from the cell array 100a and the bit line BL extending from the cell array 100b.

As described above, the bit lines BL connect the cell arrays 100a and 100b by bypassing the plate interconnection PLb provided in the same layer. As shown in FIG. 9B, the contacts SLCb extend downward from positions of the plate interconnection PLb, which do not overlap the connection lines LIb, and are connected to the source/drain regions in the diffusion layer AA of the transistor PT through the gaps between the connection lines LIb. As shown in FIG. 10B, the contacts SLCb are connected from positions of the plate interconnection PLb, which do not overlap the gates PG of the transistors PT, to the source/drain regions in the diffusion layers AA of the transistors PT through the gaps between the gates PG.

From the foregoing, the global bit line GBL is connected to one end of the current path of the transistor PT via the contact SLCb. The bit line BL and connection line LIb are connected to the other end of the current path of the transistor PT via the contact BEC.

[Multiplexer Connected to Source Line]

The multiplexer 220s connected to the source lines SLb-c (to be also simply referred to as source lines SL hereinafter) and the global source line GSL has the same wiring structure as that shown in FIGS. 6A, 6B, 7, 8, 9A, 9B, 10A, and 10B. That is, the wiring structure around the multiplexer 220s is explained by replacing the above description concerning the bit lines BL with the description concerning the source lines SL.

The source lines SL as a plurality of (e.g., 8, 16, 32, ...) source lines SL as local lines are connected to the global source line GSL as a global line. The global source line GSL electrically connects one source line SL selected from the plurality of source lines SL by the multiplexer 220s to the SA/WD 210. Consequently, the SA/WD 210 performs a write operation or the like to a specific memory cell MC.

The multiplexer 220s is arranged between the cell array 100b as a first cell array and the cell array 100c as a second cell array. The multiplexer 220s includes the transistors PT below the connection lines LIs as local lines (second local lines).

The global source line GSL is connected to one end of the current path of the transistor PT via the contact SLC as a first contact. The source line SL is connected to the other end of the current path of the transistor PT via the contact BECs as a second contact.

The contact SLC is relayed by the plate interconnection PLs through the gap between the connection line LIs and the gate PG of the transistor PT, thereby connecting the global source line GSL and source line SL.

(3) Operation of Resistance Change Memory Device

An operation example of the resistance change memory device 20 will be explained by mainly referring to FIGS. 1, 5B, and 8. The following operation is mainly performed by, e.g., the SA/WD 210, multiplexer 220, and driver 230 in accordance with instructions from the controller 190 as shown in FIG. 1 when the controller 190 has received external instructions.

In an operation such as write or read with respect to the memory cell MC, the bit line BL connected to the memory cell MC as an operation target is electrically connected to the SA/WD 210 through the global bit line GBL. The source line SL making a pair with the bit line BL is electrically connected to the SA/WD 210 through the global source line GSL in a write operation, and connected to a sink circuit (not shown) and set at the ground potential in a read operation. Also, the word line WL connected to the memory cell MC as an operation target is set at an H level. Consequently, the cell transistor CT included in the memory cell MC is turned on.

Thus, a write or read current flows from the SA/WD 210 to the memory cell MC, and a write or read operation is performed on the resistance change element R included in the memory cell MC.

In the above operation, the multiplexer 220b controls the electrical connection between the bit line BL and global bit line GBL.

That is, in the multiplexer 220b, the transistor PT provided for one bit line BL is turned on in accordance with a signal from the driver 230b. Other transistors PT are turned off. As a consequence, the bit line BL is electrically connected to the global bit line GBL. The multiplexer 220b thus controls driving of the cell arrays 100a and 100b.

In the above operation, the multiplexer 220s controls the electrical connection between the source line SL and global source line GSL.

That is, in the multiplexer 220s, the transistor PT provided for one source line SL is turned on in accordance with a signal from the driver 230s. Other transistors PT are turned off. As a consequence, the source line SL is electrically connected to the global source line GSL. The multiplexer 220s thus controls driving of the cell arrays 100b and 100c.

From the foregoing, in the cell array 100b whose driving is controlled by both the multiplexers 220b and 220s, the bit line BL and source line SL making a pair are respectively electrically connected to the global bit line GBL and global source line GSL. Also, when the cell transistor CT in one of the memory cells MC connected to the bit line BL and source line SL is turned on, the memory cell MC is selected.

It is thus possible to drive a specific memory cell MC in one cell array 100. In this embodiment, only one of the plurality of cell arrays 100 can be driven at once.

(4) Effects of this Embodiment

This embodiment achieves one or more of a plurality of effects below.

Note that this embodiment has arrangements and effects in which the description concerning the bit lines BL is replaced with the description concerning the source lines SL. That is, in the following description, it is possible to replace the bit line BL with the source line SL, the global bit line GBL with the global source line GSL, the connection line LIb with the connection line LIs, the plate interconnection PLb with the plate interconnection PLs, the contact SLCb with the contact SLC, and the contact BEC with the contact BECs.

(A) In this embodiment, the multiplexers 120 arranged between the cell arrays 100 are collectively provided between the cell arrays 100 in one-to-one correspondence with them, and control driving of the cell arrays 100. The driver 130 drives these multiplexers 120. This makes it possible to reduce the whole width of the multiplexers 120 and driver 130 provided between the cell arrays 100.

In the multiplexer 120' shown in FIG. 3 described earlier, when the transistor is configured as a buried gate transistor, this transistor can be made relatively small, e.g., can be formed such that the cell size (the width in the Y direction) is about 60 nm. In the buried gate transistor, a channel is formed around a buried gate. Therefore, the buried gate transistor can secure a sufficient channel length even when the transistor is downsized. Accordingly, when the multiplexer 120' is, e.g., a 16:1 switch for controlling 16 bit lines BL, the Y-direction width of the multiplexer 120' is about 2 μm even if an isolation gate is disposed for every other transistor gate. The width is 4 μm even for two multiplexers 120'.

On the other hand, in the driver 130' arranged in the peripheral region, it is difficult to use the buried gate transistor which is used in the cell region. Therefore, a core transistor or the like is used in the driver 130'. Accordingly, two drivers 130' have a width of about 6 μm to 7 μm which is larger than, e.g., the width of two multiplexers 120'.

In this embodiment, two multiplexers 120 for controlling different cell arrays 100 are arranged adjacent to each other. This facilitates obtaining the arrangement in which one driver 130 controls two multiplexers 120. Since the driver 130 is shared, the width of the driver 130 can be decreased to, e.g., about 5 μm. Accordingly, the whole width can be reduced. Further, since the width of the two multiplexers 120 is about 4 μm, the width of the driver 130 is almost equal to this width, so an extra space can be eliminated.

(B) In this embodiment, the multiplexer 220 arranged between the cell arrays 100 is provided in common to the cell arrays 100, and controls driving of the cell arrays 100. The driver 230 drives the multiplexer 220. This makes it possible to reduce the whole width of the multiplexer 220 and driver 230 provided between the cell arrays 100.

In the multiplexer 220' shown in FIG. 4 described above, a transistor configured as a planar transistor has a size larger than that of a transistor configured as, e.g., a buried gate transistor. When the multiplexer 220' is, e.g., a 16:1 switch for controlling 16 bit lines BL, therefore, the width of the multiplexer 220' in the Y direction is, e.g., about 8 μm in some cases. The width is 16 μm when the number of multiplexers 220' is two. In this case, even when, e.g., the drivers 230' are integrated into one driver, the width of the two multiplexers 220' is larger, so the whole width cannot be reduced.

In this embodiment, one multiplexer 220 and one driver 230 control the cell arrays 100 on the two sides. A common bit line BL is used for the cell arrays 100. Accordingly, the number of bit lines BL to be controlled by the multiplexer 220 is 16 in this case as well, so the number of necessary transistors is 16, i.e., the same as that in the multiplexer 220'. This makes the size of the multiplexer 220 equivalent to that of the multiplexer 220'. By sharing the multiplexer 220 by the cell arrays 100, therefore, the width of the multiplexer 220 can be decreased to about a half of 16 μm.

(C) In this embodiment, the global bit line GBL is connected to one end of the current path of the transistor PT via the contact SLCb, and the connection line LIb is connected to the other end of the current path of the transistor PT via the contact BEC. Two connection lines LIb adjacent to each other have a pitch narrower than that between two global bit lines GBL adjacent to each other. The contact SLCb runs through the two adjacent connection lines LIb and connects the global bit line GBL and transistor PT.

In this embodiment, a plurality of bit lines BL connect the cell arrays 100a and 100b via the connection lines LIb. The bit lines BL and connection lines LIb have a pitch narrower than that of, e.g., the global bit lines GBL. The multiplexer 220b must connect these lines having at different pitches. When the bit lines BL and connection lines LIb are formed by using the sidewall transfer technique, it is difficult to, e.g., form a bent line and change the pitch as needed. Consequently, the degree of freedom of the wiring layout is further reduced.

In this embodiment, the multiplexer 220b can connect the bit lines BL and connection lines LIb with a narrow pitch to the global bit lines GBL with a relatively wide pitch in this case as well.

(D) In this embodiment, the plate interconnection PLb is provided between the cell arrays 100a and 100b, and the contact SLCb is relayed by the plate interconnection PLb, and connects the global bit line GBL and transistor PT.

The plate interconnection PLb has a width larger than that of the bit line BL and connection line LIb in the X direction. Accordingly, the position of the contact SLCb in the plate interconnection PLb can be adjusted so that the contact SLCb passes through the gap between the connection lines LIb.

The plate interconnection PLb has a width larger than that of the gate PG of the transistor PT in the Y direction. Therefore, the position of the contact SLCb in the plate interconnection PLb can be adjusted so that the contact SLCb passes through the gap between the gates PG.

As described above, the plate interconnection PLb makes it possible to adjust the position of the contact SLCb such that the contact SLCb passes through the gap between the connection line LIb and gate PG intersecting each other when viewed from above.

(E) In this embodiment, the connection lines LIb are arranged in a layer different from that of the bit lines BL. The plate interconnections PLb are arranged in the same layer as that of the bit lines BL.

Since the plate interconnection PLb and connection lines LIb are arranged in different layers as described above, the plate interconnection PLb can be arranged while maintaining the connection between the cell arrays 100a and 100b by the connection lines LIb.

Further, the plate interconnection PLb is formed by using the wiring level of the bit lines BL. In this case, it is possible to simultaneously form, e.g., the bit lines BL (and source lines SL) and the plate interconnection PLb, so the manufacturing process is simplified.

(F) In this embodiment, the connection lines LIb are arranged in a layer below the bit lines BL, and the plate interconnection PLb is arranged in the same layer as that of the bit lines BL.

The connection lines LIb are arranged in a relatively low layer as described above, and this facilitates connection to the multiplexer 220b arranged near the substrate. Further, the plate interconnection PLb is arranged in a relatively high layer (the M0 layer level), and this facilitates connection to the global bit line GBL being an upper-layer wire (the M1 layer level wire).

(G) In this embodiment, the connection lines LIb are arranged in the same layer as that of the resistance change elements R. This makes it possible to arrange the connection lines LIb by using the wiring level of the resistance change elements R not used in the multiplexer 220b.

Further, the connection line LIb can be connected to the upper and lower layers by using the contacts TE and BEC which are of the same kind as the contacts TE and BEC for connecting the resistance change element R to the upper and lower layers in the memory cell MC. Accordingly, it is possible to simultaneously form the contact TE in the memory cell MC and the contact TE of the connection line LIb, and simultaneously form the contact BEC in the memory cell MC and the contact BEC of the connection line LIb.

(5) Modification of this Embodiment

A modification of this embodiment will be explained with reference to FIGS. 11A, 11B, 12, 13A, 13B, 14A, and 14B. A resistance change memory device 30 of this modification differs from the above-described embodiment in that a transistor BT of a multiplexer 320 is configured as a buried gate transistor.

Figure 11A:
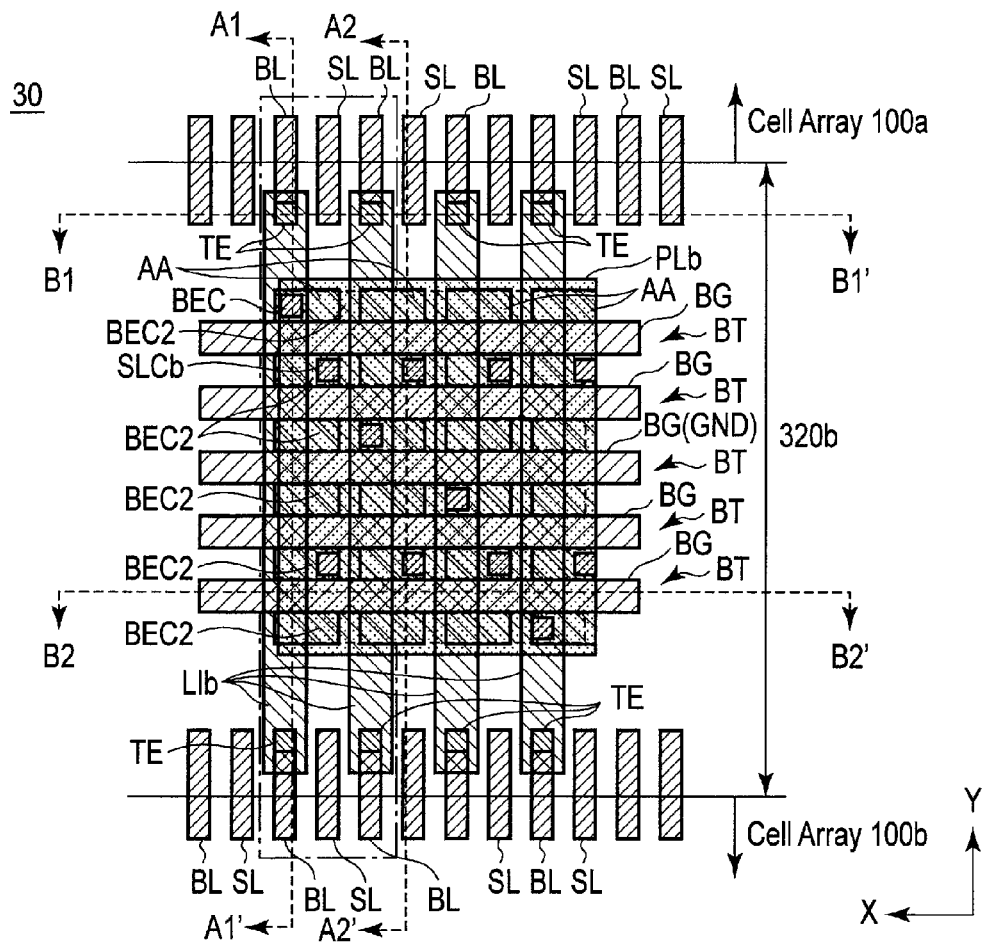
FIG. 11A shows the upper surface of a multiplexer of a memory device according to a modification of the first embodiment.

FIG. 11A shows the upper surface of the multiplexer of the memory device according to the modification of this embodiment.

As shown in FIG. 11A, a multiplexer 320b is connected to the bit lines BL and interconnection lines LIb for connecting the cell arrays 100a and 100b, and to the global bit line GBL.

Figure 11B:
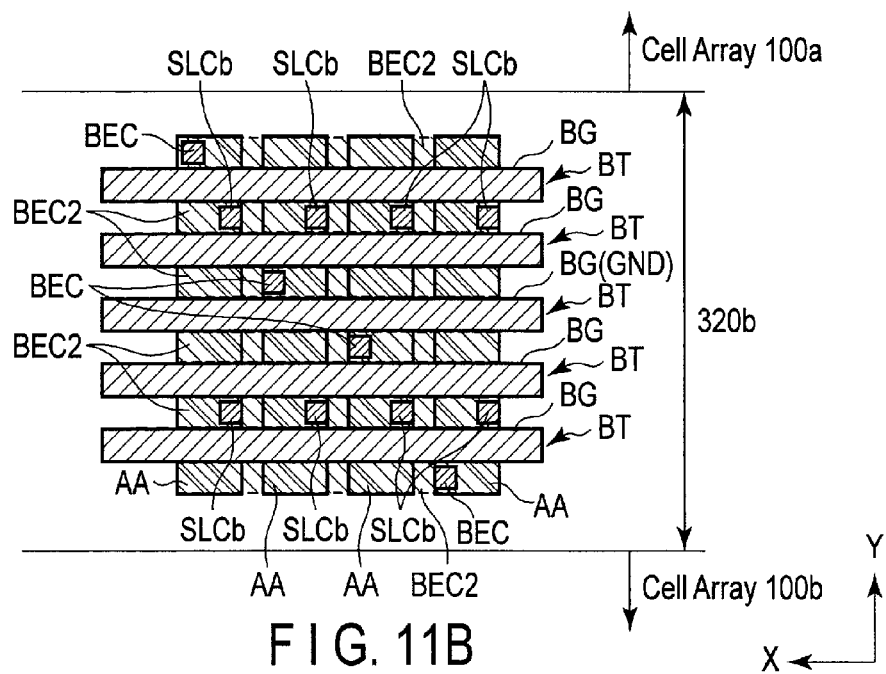
FIG. 11B shows the lower structure of the multiplexer of the memory device according to the modification of the first embodiment.
Figure 12:
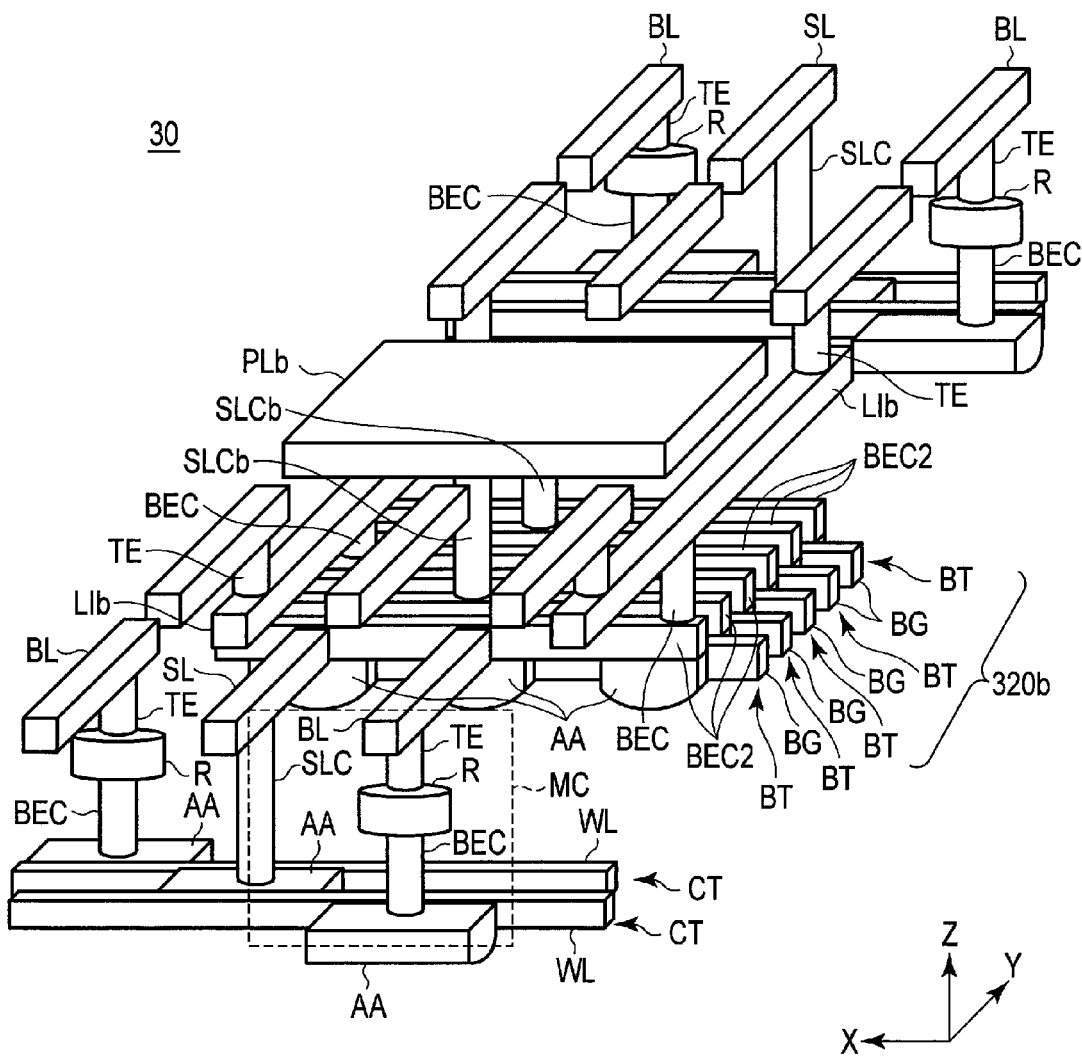
FIG. 12 shows the three-dimensional structure of the multiplexer of the memory device according to the modification of the first embodiment.

FIG. 11B shows the lower structure of the multiplexer of the memory device according to this modification. FIG. 12 shows the three-dimensional structure of the multiplexer of the memory device according to this modification. FIG. 12 is a perspective view including a portion indicated by the one-dot dashed lines in FIG. 11A and the memory cell structure. FIG. 12 does not illustrate the structure between the memory cell and multiplexer 320b. Further, in FIG. 12, for the purpose of convenience, the same line widths of the connection lines LIb as the line widths of the bit lines BL, are illustrated. In the actual configuration, however, the line widths of the connection lines LIb may be larger than the line widths of the bit lines BL as illustrated in FIGS. 11A, 13A, and 13B, or may be smaller than the line widths of the bit lines BL.

As shown in FIG. 11B and FIG. 12, the multiplexer 320b includes a plurality of transistors BT. The transistor BT is configured as a buried gate transistor in which its gate is buried in the substrate. The transistor BT can have practically the same structure as that of the cell transistor CT, and can be formed by practically the same steps as those of the cell transistor CT. In other words, the transistor BT can have one of the plurality of structures formed as the cell transistor CT. Like the cell transistors CT, the transistors BT may also be arranged in the cell region including the cell array 100.

A gate BG extends in, e.g., the X direction in the substrate. A plurality of diffusion layers AA extending in the Y direction are formed around the gate BG. The diffusion layers AA include source/drain regions on the two sides of the gate BG. Contacts BEC2 extending in the X direction are provided above the diffusion layers AA on the two sides of the gate BG. The contacts BEC2 connect the diffusion layers AA in parallel, which are divided in the Y direction. A contact SLCb is provided on the source/drain region of the diffusion layer AA on one side of the gate BG via the contact BEC2. A contact BEC is provided on the source/drain region of the diffusion layer AA on the other side of the gate BG via the contact BEC2.

Figure 13A:
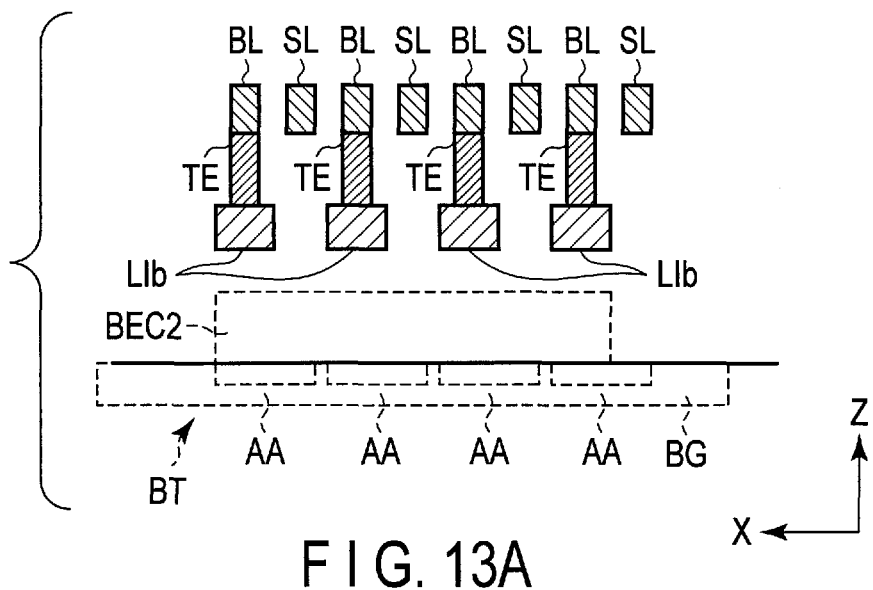
FIG. 13A shows a section taken along a line B1-B1' in FIG. 11A.
Figure 13B:
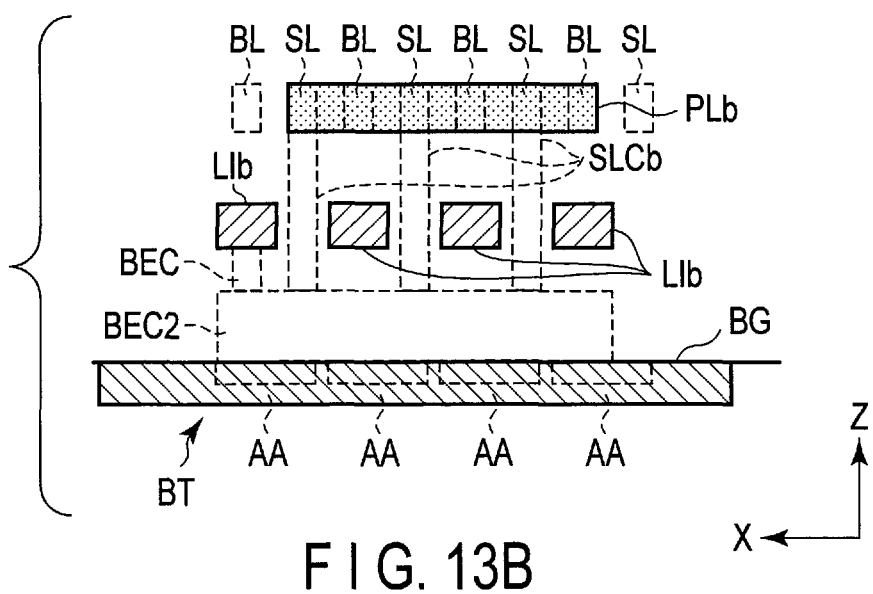
FIG. 13B shows a section taken along a line B2-B2' in FIG. 11A.

FIG. 13A shows a section taken along a line B1-B1' in FIG. 11A. FIG. 13B shows a section taken along a line B2-B2' in FIG. 11A. FIG. 14A shows a section taken along a line A1-A1' in FIG. 11A. FIG. 14B shows a section taken along a line A2-A2' in FIG. 11A.

As shown in FIGS. 13A, 13B, 14A, and 14B, the multiplexer 320b differs from the multiplexer 220b of the above-described embodiment in that the transistor BT is configured as a buried gate transistor, and the contacts SLCb and BEC are connected to the transistor BT via the contacts BEC2.

That is, the positional relationship between the bit lines BL and source lines SL, the positional relationship between the bit lines BL, source lines SL, connection lines LIb, and global bit lines GBL, the layout of the contacts TE and BEC connected to the bit lines BL, the layout of the contacts SLC connected to the source lines SL, the layout of the contacts SLCb connected to the global bit lines GBL, and the like are the same as those in the multiplexer 220b of the above-described embodiment.

A multiplexer 320s connected to the source lines SLb-c and global source lines GSL also has the same wiring structure as that shown in FIGS. 11A, 11B, 12, 13A, 13B, 14A, and 14B.

This modification achieves one or more of a plurality of effects below, other than the effects of the above-described embodiment.

In this modification, the transistor BT of the multiplexer 320 is configured as a buried gate transistor. This makes downsizing of the multiplexer 320 feasible.

In this modification, the transistor BT of the multiplexer 320 has the same structure as that of the cell transistor CT of the memory cell MC. This makes it possible to form the transistor BT and cell transistor CT in practically the same steps. Therefore, the manufacturing cost can be reduced.

Second Embodiment

A memory device according to this embodiment will be explained below.

(1) Outline of Resistance Change Memory Devices

An outline of resistance change memory devices 11 and 21 according to this embodiment will be explained with reference to FIGS. 15A and 15B. This embodiment differs from the above-described embodiment in that bit lines BL and source lines SL are arranged in different layers.

Figure 15A:
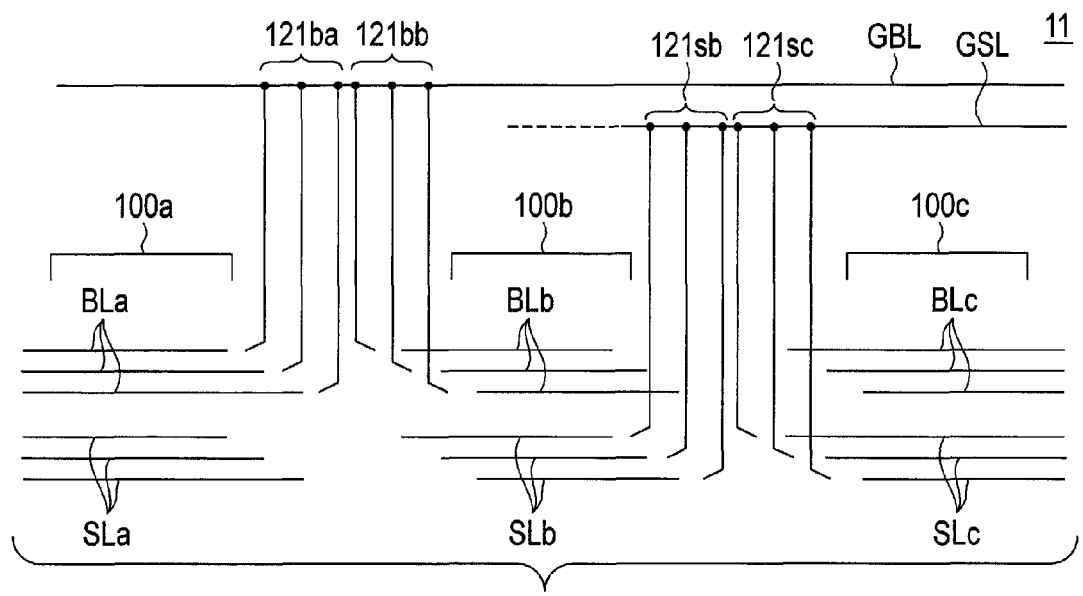
FIG. 15A shows the wiring structure of a memory device according to the second embodiment.

FIG. 15A shows the wiring structure of the memory device according to this embodiment. That is, FIG. 15A shows the resistance change memory device 11. The resistance change memory device 11 has an arrangement in which the resistance change memory device 10 shown in FIG. 2 described previously is replaced with the wiring structure of this embodiment.

As shown in FIG. 15A, the resistance change memory device 11 includes a plurality of bit lines BL (BLa, BLb, and BLc), and a plurality of source lines SL (SLa, SLb, and SLc) arranged below the bit lines BL.

A multiplexer 121ba for electrically connecting the bit lines BLa to a global bit line GBL and a multiplexer 121bb for electrically connecting the bit lines BLb to the global bit line GBL are provided between cell arrays 100a and 100b. A multiplexer 121sb for electrically connecting the source lines SLb to a global source line GSL and a multiplexer 121sc for electrically connecting the source lines SLc to the global source line GSL are provided between the cell array 100b and a cell array 100c.

Figure 15B:
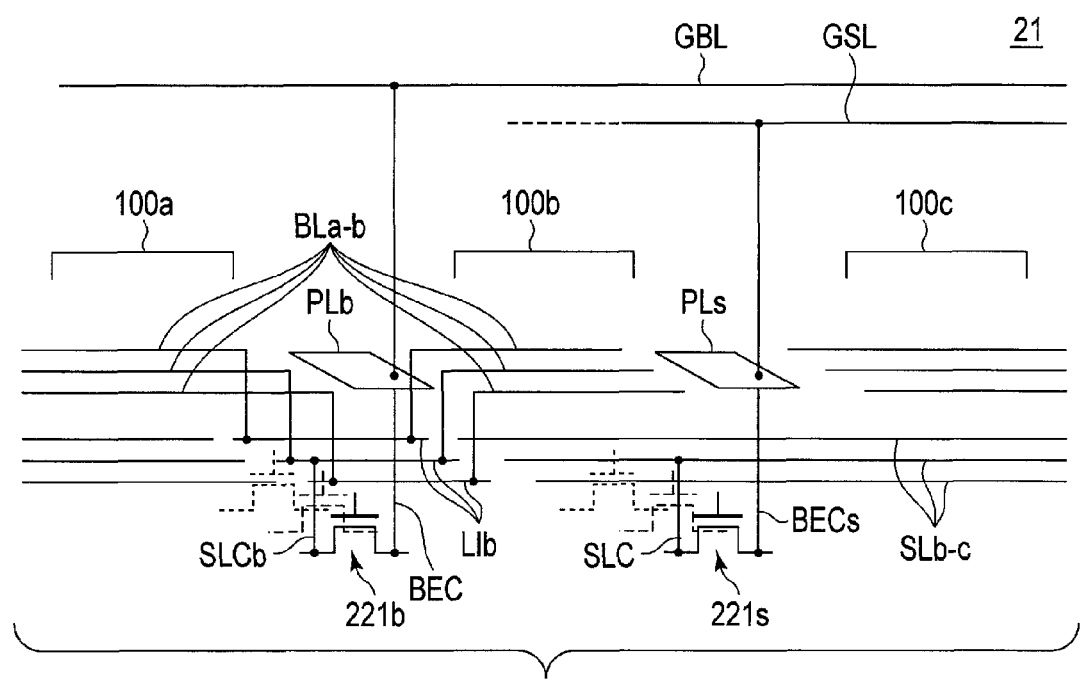
FIG. 15B shows the wiring structure of another memory device according to the second embodiment.

FIG. 15B shows the wiring structure of the other memory device according to this embodiment. That is, FIG. 15B shows the resistance change memory device 21. The resistance change memory device 21 has an arrangement in which the resistance change memory device 20 shown in FIG. 2 described previously is replaced with the wiring structure of this embodiment.

In the resistance change memory device 21 as shown in FIG. 15B, a plurality of bit lines BL and a plurality of source lines SL connect a plurality of cell arrays 100 (100a, 100b, and 100c). The source lines SL are arranged in positions below the bit lines BL and overlapping the bit lines BL. A multiplexer 221 must connect the bit lines BL and source lines SL having a narrow pitch to the global bit line GBL and global source line GSL having a relatively wide pitch in this arrangement as well.

As described above, when the plurality of cell arrays 100 share the multiplexer 221, the arrangement of the multiplexer 221 is a matter.

In this embodiment, therefore, a plate interconnection PL is provided in, e.g., the same layer as that of the bit lines BL between the cell arrays 100. The plate interconnection PL relays the multiplexer 221 provided near the substrate surface to the global bit line GBL and global source line GSL.

The bit lines BL connect the cell arrays 100 via connection lines LIb arranged in the same layer as that of, e.g., the source layers SL between the cell arrays 100. More specifically, a plate interconnection PLb, the connection lines LIb, and a multiplexer 221b are arranged between the cell arrays 100a and 100b. The plate interconnection PLb is connected to the global bit line GBL. The connection lines LIb are connected to bit lines BLa-b extending from inside the cell arrays 100a and 100b. The multiplexer 221b is connected to the lines GBL, BL, and LIb. That is, the multiplexer 221b is connected to the global bit line GBL via a contact BEC, and to the bit lines BL via a contact SLCb and the connection lines LIb.

The source lines SL directly connect the cell arrays 100. More specifically, a plate interconnection PLs, source lines SLb-c, and a multiplexer 221s are arranged between the cell arrays 100b and 100c. The plate interconnection PLs is connected to the global source line GSL. The source lines SLb-c connect the cell arrays 100b and 100c. The multiplexer 221s is connected to the lines GSL and SL. That is, the multiplexer 221s is connected to the global source line GSL via a contact BECs, and to the source lines SL via a contact SLC.

The wiring structure shown in FIG. 15B will be explained in more detail below.

(2) Configuration Example of Resistance Change Memory Device

Figure 16:
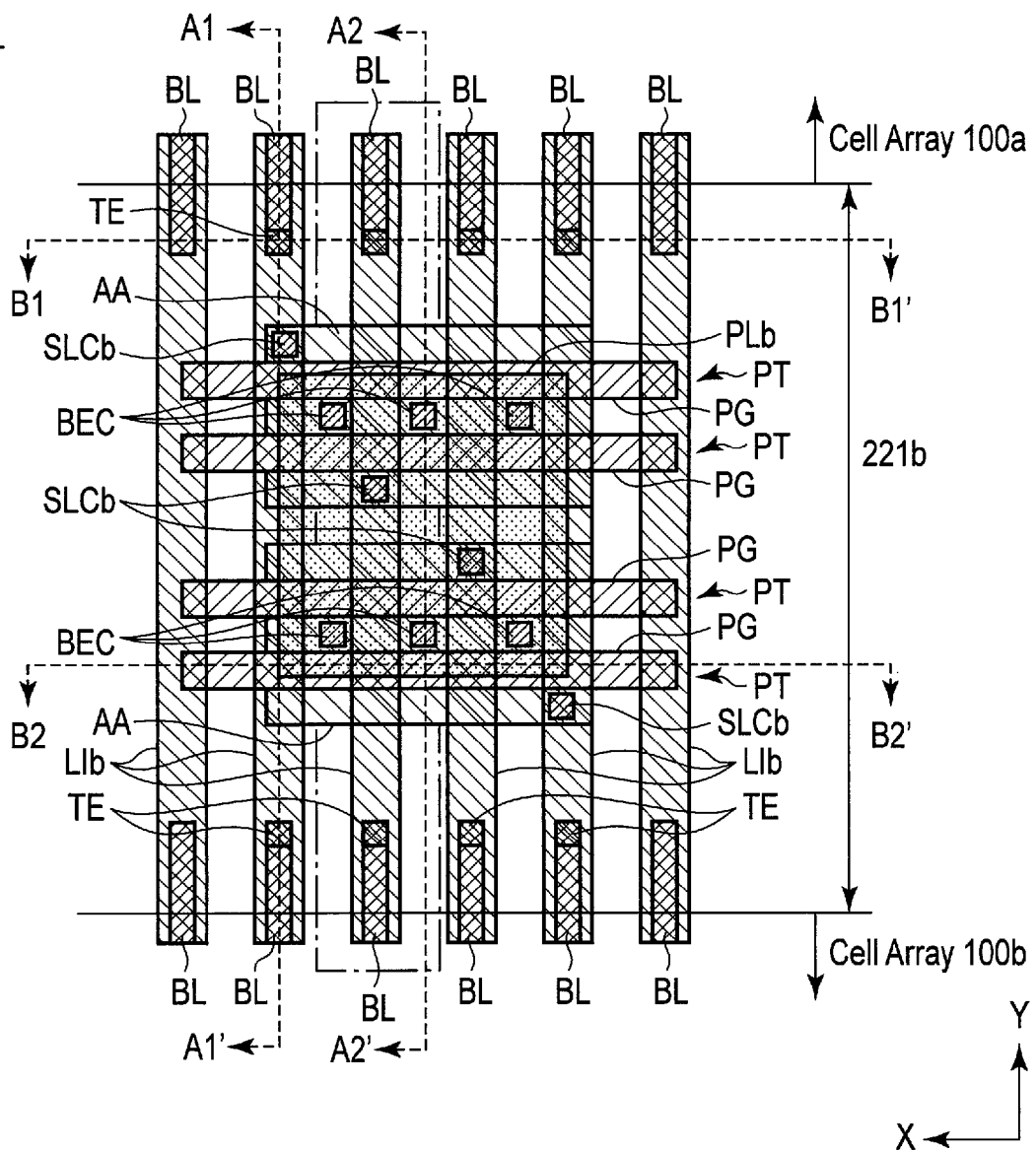
FIG. 16 shows the upper surface of a multiplexer of the memory device according to the second embodiment.
Figure 17:
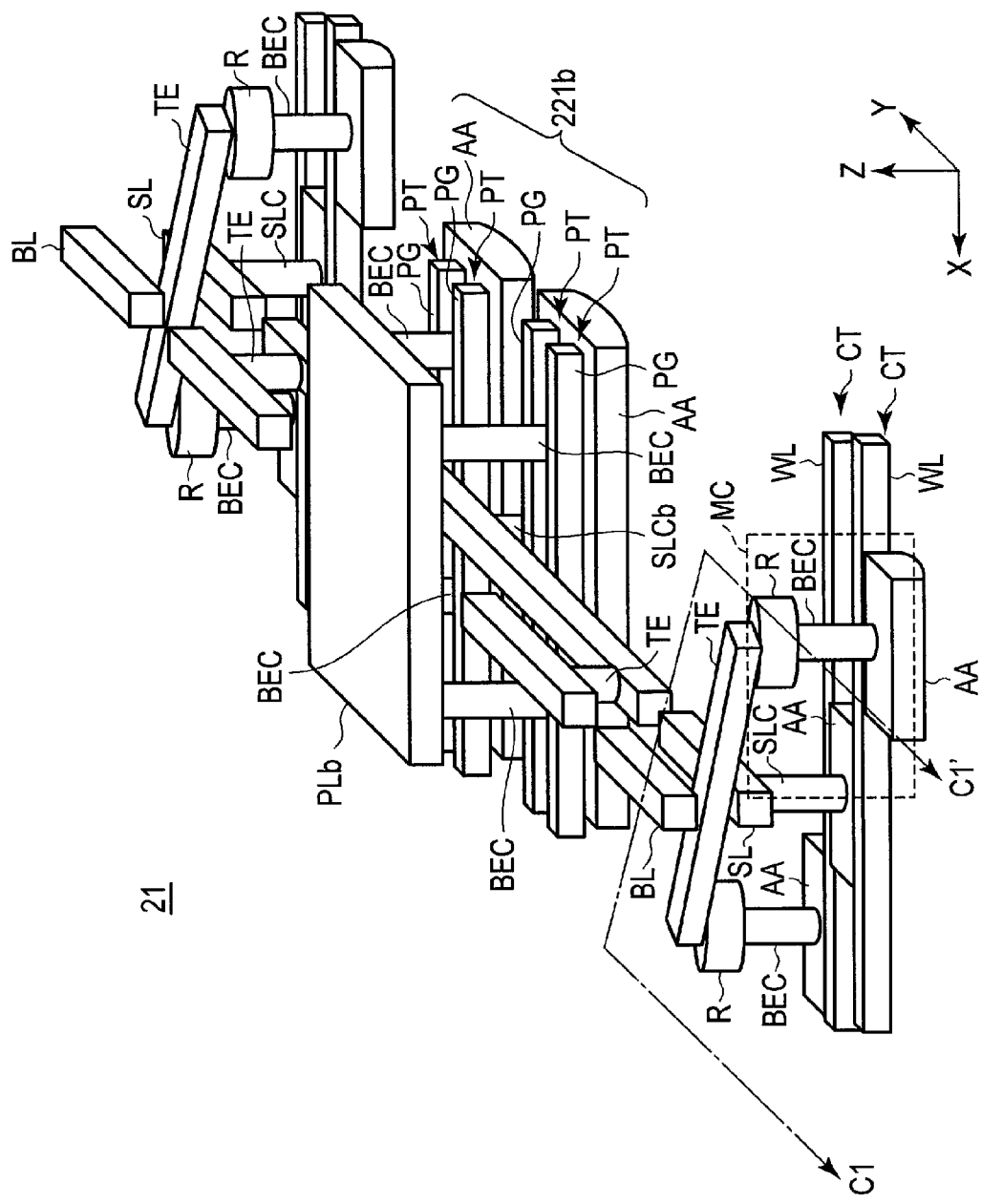
FIG. 17 shows the three-dimensional structure of the multiplexer of the memory device according to the second embodiment.

A configuration example of the resistance change memory device 21 according to this embodiment will be explained with reference to FIGS. 16, 17, 18, 19A, 19B, and 20A, and 20B. FIGS. 16, 17, 18, 19A, 19B, and 20A, and 20B illustrate a wiring structure around the multiplexer 221b, which is connected to the bit lines BLa-b (to be also simply referred to as bit lines BL hereinafter) as local lines (first local lines), and to the global bit line GBL as a global line. In FIG. 16, for the purpose of convenience, the larger line widths of the connection lines LIb than the line widths of the bit lines BL, are illustrated. In the actual configuration, however, the line widths of the connection lines LIb may be equal to the line widths of the bit lines BL as illustrated in FIGS. 17, 19A, and 19B, or may be smaller than the line widths of the bit lines BL.

[Multiplexer and Transistor]

FIG. 16 shows the upper surface of the multiplexer of the memory device according to this embodiment.

As shown in FIG. 16, the multiplexer 221b is arranged between the cell array 100a as a first cell array, and the cell array 100b as a second cell array. The bit lines BL run in the Y direction from the cell arrays 100a and 100b. The source lines SL (not shown) are arranged in positions below the bit lines BL and overlapping the bit lines BL when viewed from above, and run in the Y direction from the cell arrays 100a and 100b. The connection lines LIb as local lines (second local lines) are arranged in, e.g., the same layer as that of the source lines SL, on extension lines of the source lines SL when viewed from above. The bit lines BL extending from the cell array 100a are connected to the bit lines BL extending from the cell arrays 100b via the connection lines LIb. The connection lines LIb can also be regarded as portions of the bit lines BLa-b for connecting the cell arrays 100a and 100b. That is, the connection lines LIb and bit lines BLa-b can also be regarded as one local line.

FIG. 17 shows the three-dimensional structure of the multiplexer of the memory device according to this embodiment. FIG. 17 is a perspective view including a portion indicated by the one-dot dashed lines in FIG. 16 and the structure of a memory cell MC. FIG. 17 omits the structure between the memory cell MC and multiplexer 221b.

As shown in FIGS. 16 and 17, a plurality of transistors PT of the multiplexer 221b are configured as, e.g., planar transistors. The contact BEC as a first contact is provided on a source/drain region in a diffusion layer AA on one side of a gate PG of the transistor PT. The contact SLCb as a second contact is provided on a source/drain region in a diffusion layer AA on the other side of the gate PG.

As shown in FIG. 16, the contacts BEC are provided at positions not overlapping the bit lines BL and connection lines LIb (and the source lines SL) when viewed from above, and are connected directly or indirectly to the global bit line GBL above the contacts BEC. The contacts SLCb are provided at positions overlapping the bit lines BL and connection lines LIb (and the source lines SL) when viewed from above, and are connected directly or indirectly to the bit lines BL above the contacts SLCb. In this description, "above" is an upper portion in the Z direction shown in, e.g., FIG. 17.

Accordingly, one end of the current path of the transistor PT is connected to the global bit line GBL via the contact BEC. The other end of the current path of the transistor PT is connected to the bit line BL via the contact SLCb.

[Memory Cell]

FIG. 18 shows a section of the memory cell of the memory device according to this embodiment. FIG. 18 shows a section taken along a line C1-C1' in FIG. 17.

As shown in FIGS. 17 and 18, a resistance change element R of the memory cell MC is arranged in a position not overlapping the bit line BL and source line SL when viewed from above, and in a layer between the bit line BL and source line SL. One end of the resistance change element R is connected to the bit line BL via a contact TE. The other end of the resistance change element R is connected to a source/drain region SD provided in the substrate via the contact BEC. The contact TE is connected to the lower end of the bit line BL, and extends in a direction from one side to the other of the bit line BL (in a direction not perpendicular to the bit lines BL, the source lines SL, and word lines WL). One end of the resistance change element R is connected to each of the two ends of the contact TE.

A cell transistor CT is configured as, e.g., a buried gate transistor. As described above, one of the source/drain regions SD of the cell transistor CT, which sandwich the word line WL, is connected to the contact BEC of the resistance change element R. The other one of the source/drain regions SD sandwiching the word line WL is connected to the contact SLC, and the contact SLC is connected to the source line SL. The contact SLC is provided at a position overlapping the source line SL (and the bit line BL) when viewed from above, and is connected directly or indirectly to the source line SL above the contact SLC in the Z direction.

In this arrangement, the resistance change element R and cell transistor CT are connected in series, thereby forming a current path including the bit line BL, resistance change element R, cell transistor CT, and source line SL. The resistance change element R and cell transistor CT form one set, and two sets of the resistance change elements R and cell transistors CT share the bit line BL, the contact TE, the source line SL, the contact SLC, and the source/drain regions SD below the contact SLC. As shown in FIG. 17, the resistance change elements R making a pair are arranged obliquely to both the bit line BL/source line SL and the word line WL intersecting each other in the X and Y directions. A plurality of resistance change elements R making pairs are arranged in the X direction and connected to a common word line WL.

[Plate Interconnection and Connection Line]

FIG. 19A shows a section taken along a line B1-B1' in FIG. 16. FIG. 19B shows a section taken along a line B2-B2' in FIG. 16. FIG. 20A shows a section taken along a line A1-A1' in FIG. 16. FIG. 20B shows a section taken along a line A2-A2' in FIG. 16.

As shown in FIGS. 19B and 20A, the plate interconnection PLb is provided in the same layer as that of the bit lines BL, above the transistor PT of the multiplexer 221b. The connection line LIb is provided in a layer different from that of the bit lines BL, e.g., in the same layer as that of the source lines SL below the bit lines BL. The bit line BL is connected to the connection line LIb via the contact TE, and the connection line LIb is connected to the source/drain region in the diffusion layer AA of the transistor PT via the contact SLCb.

Thus, the bit lines BL connect the cell arrays 100a and 100b by bypassing the plate interconnection PLb provided in the same layer. As shown in FIG. 19B, the contacts BEC extend downward from positions of the plate interconnection PLb which do not overlap the connection lines LIb, and are connected to the source/drain regions in the diffusion layer AA of the transistor PT through the gaps between the connection lines LIb. As shown in FIG. 20B, the contacts BEC are connected from positions of the plate interconnection PLb which do not overlap the gates PG of the transistors PT, to the source/drain regions in the diffusion layers AA of the transistors PT through the gaps between the gates PG.

From the foregoing, the global bit line GBL is connected to one end of the current path of the transistor PT via the contact BEC. The bit line BL and connection line LIb are connected to the other end of the current path of the transistor PT via the contact SLCb.

[Multiplexer Connected to Source Line]

The multiplexer 221s is connected to the source line SLb-c (to be also simply referred to as a source line SL hereinafter) and the global source line GSL. The cell arrays 100b and 100c between which the multiplexer 221s is arranged are directly connected by the source lines SL, and the source lines SL do not have a connection line and the like. The multiplexer 221s has the same wiring structure as that shown in FIGS. 16, 17, 18, 19A, 19B, 20A, and 20B except for the above feature. That is, the wiring structure around the multiplexer 221s is explained by replacing the above description concerning the bit lines BL with the description concerning the source lines SL.

More specifically, the multiplexer 221s is arranged between the cell array 100b as a first cell array and the cell array 100c as a second cell array. The multiplexer 221s includes the transistors PT below the source lines SLb-c as local lines (third local lines).

The global source line GSL as a global line is connected to one end of the current path of the transistor PT via the contact BECs as a first contact. The source line SL is connected to the other end of the current path of the transistor PT via the contact SLC as a second contact.

The contact BECs is relayed by the plate interconnection PLs through the gap between the source lines SL and the gates PG of the transistors PT, thereby connecting the global source line GSL and source line SL.

As described above, the plate interconnection PL connected to the global line in the upper layer is preferably arranged in a comparatively upper portion, and the local lines with a narrow pitch are preferably arranged in a lower portion close to the multiplexer 221.

In this embodiment, the local lines include the bit lines BL and the source lines SL arranged in a layer different from that of the bit lines BL. Therefore, by arranging the plate interconnection PLs by using the wiring level of the bit lines BL not used in the multiplexer 221s, the connection between the cell arrays 100b and 100c by the source lines SL can be maintained without using any interconnection line.

Further, this embodiment includes the source lines SL in the layer in which the connection lines LIb are arranged. That is, the connection lines LIb can be provided by using the interconnection level of the source lines SL not used in the multiplexer 221b. In this case, it is possible to simultaneously form, e.g., the source lines SL and connection lines LIb, so the manufacturing process is simplified.

As described above, this embodiment achieves one or more of the plurality of effects described above other than the effects of the above-described embodiment.

(3) Modification of this Embodiment

A modification of this embodiment will be explained with reference to FIGS. 21, 22, 23A, 23B, 24A, and 24B. A resistance change memory device 31 of this modification differs from the multiplexer 221 of the above-described embodiment in that the transistor BT of a multiplexer 321 is configured as a buried gate transistor.

Figure 21:
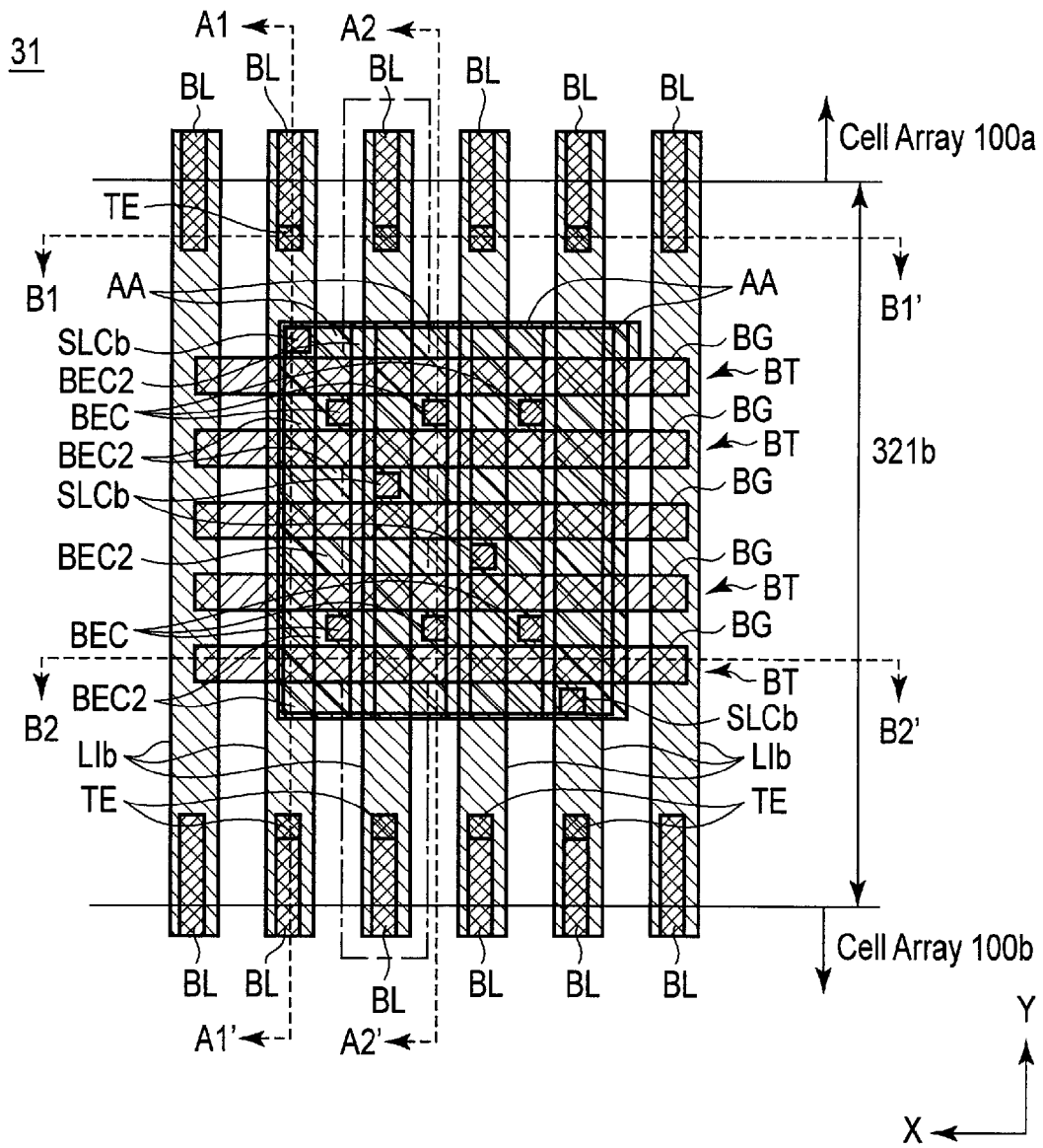
FIG. 21 shows the upper surface of a multiplexer of a memory device according to a modification of the second embodiment.
Figure 22:
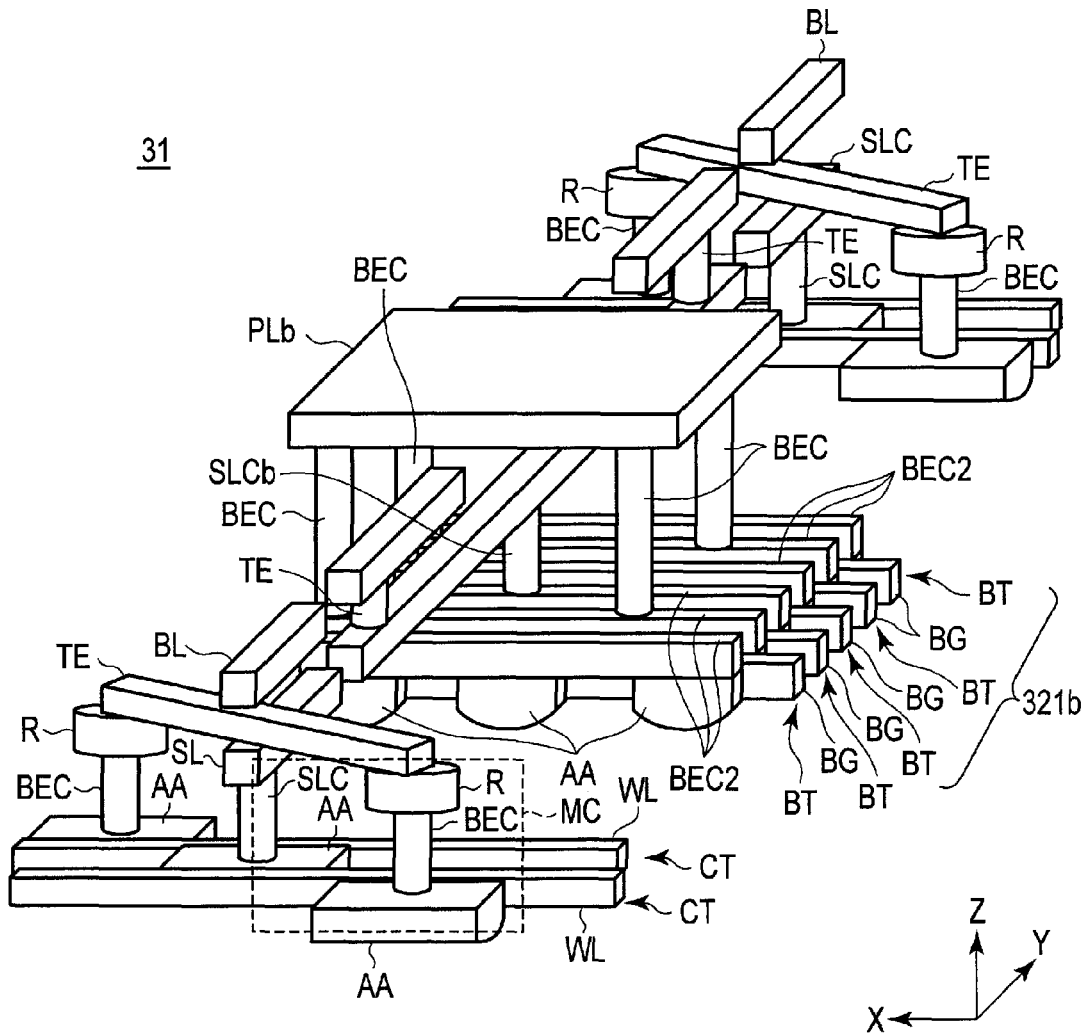
FIG. 22 shows the three-dimensional structure of the multiplexer of the memory device according to the modification of the second embodiment.
Figure 23A:
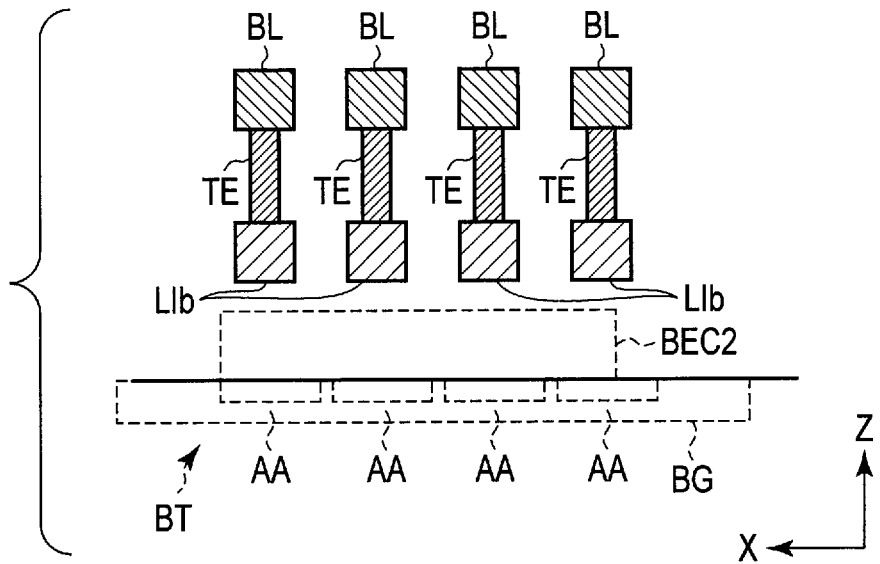
FIG. 23A shows a section taken along a line B1-B1' in FIG. 21.
Figure 23B:
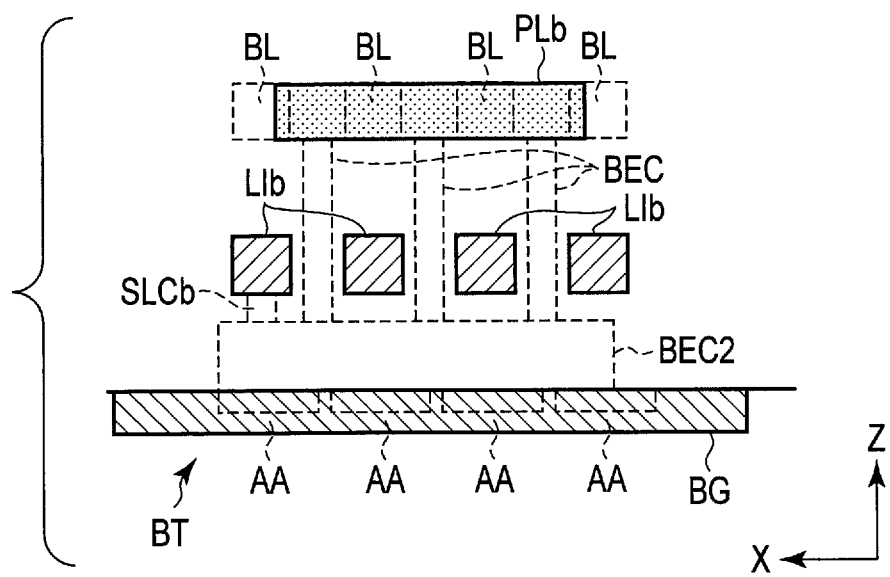
FIG. 23B shows a section taken along a line B2-B2' in FIG. 21.

FIG. 21 shows the upper surface of the multiplexer of the memory device according to the modification of this embodiment. In FIG. 21, for the purpose of convenience, the larger line widths of the connection lines LIb than the line widths of the bit lines BL, are illustrated. In the actual configuration, however, the line widths of the connection lines LIb may be equal to the line widths of the bit lines BL as illustrated in FIGS. 22, 23A, and 23B, or may be smaller than the line widths of the bit lines BL. FIG. 22 shows the three-dimensional structure of the multiplexer of the memory device according to this modification. FIG. 22 is a perspective view including a portion indicated by the one-dot dashed lines in FIG. 21 and the structure of the memory cell MC. FIG. 22 does not illustrate the structure between the memory cell MC and a multiplexer 321b.

As shown in FIG. 21, the multiplexer 321b is connected to the bit lines BL for connecting the cell arrays 100a and 100b, and to the global bit line GBL.

As shown in FIGS. 21 and 22, a plurality of transistors BT of the multiplexer 321b are configured as buried gate transistors. The contact BEC as a first contact is provided in the source/drain region in the diffusion layer AA on one side of the gate BG of the transistor BT via a contact BEC2. The contact SLCb as a second contact is provided in the source/drain region in the diffusion layer AA on the other side of the gate BG via the contact BEC2.

FIG. 23A shows a section taken along a line B1-B1' in FIG. 21. FIG. 23B shows a section taken along a line B2-B2' in FIG. 21. FIG. 24A shows a section taken along a line A1-A1' in FIG. 21. FIG. 24B shows a section taken along a line A2-A2' in FIG. 21.

As shown in FIGS. 23A, 23B, 24A, and 24B, the multiplexer 321b differs from the multiplexer 221b of the above-described embodiment in that the transistor BT is configured as a buried gate transistor, and the contacts BEC and SLCb are connected to the transistor BT via the contacts BEC2.

That is, the positional relationship between the bit lines BL and source lines SL, the positional relationship between the bit lines BL, source lines SL, connection lines LIb, and global bit lines GBL, the layout of the contacts TE and SLCb connected to the bit lines BL, the layout of the contacts SLC connected to the source lines SL, the layout of the contacts BEC connected to the global bit lines GBL, and the like are the same as those in the multiplexer 221b of the above-described embodiment.

A multiplexer 321s connected to the source lines SLb-c and global source lines GSL also has the same wiring structure as that shown in FIGS. 16, 17, 18, 19A, 19B, 20A, and 20B.

Other Embodiments

In the above-described embodiments and modifications, the example in which the plate interconnections PL are arranged by using the wiring level of the bit lines BL, and, when the bit lines BL and source lines SL are arranged in different layers, the connection lines LI are arranged by using the wiring level of the source lines SL has been explained. However, the present invention is not limited to this. The plate interconnections PL and connection lines LI may also be arranged in wiring levels different from those of the bit lines BL and source lines SL.

In the above-described embodiments and modifications, the example in which the plate interconnection PL has a width larger than that of the bit line BL and source line SL in the X direction has been explained. However, the present invention is not limited to this. The plate interconnection may also be a line interconnection having a width equal to or smaller than that of the bit line and source line. This line interconnection can be arranged in a position not overlapping the bit line and source line when viewed from above. Accordingly, the first contact extending through the gap between the bit line and source line can be connected to the multiplexer.

In the above-described embodiments and modifications, the example in which the plate interconnection PL has a width larger than that of the gates PG and BG of the transistors PT and BT in the Y direction has been explained. However, the present invention is not limited to this. The plate interconnection may also be a line interconnection having a width equal to or smaller than that of the gate of the transistor. This line interconnection can be arranged in a position not overlapping the gate when viewed from above. Accordingly, the first contact extending through the gap between the gates can be connected to the multiplexer.

In the drawings of the above-described embodiments and modifications, the contacts TE for connecting the bit lines BL and connection lines LIb are arranged in a line in the X direction. However, the present invention is not limited to this. The Y-direction positions of the above-mentioned contacts arranged in the X direction may also be shifted. For example, the Y-direction positions of contacts provided for even-numbered bit lines and those of contacts provided for odd-numbered bit lines may also be staggered (zigzagged). Alternatively, the Y-direction positions of the above-mentioned contacts may also be gradually shifted toward the cell array or multiplexer in one way in the X direction. By shifting the Y-direction positions of the above-mentioned contacts, it is possible to suppress interference between these contacts.

In the above-described embodiments and modifications, the example in which the driver and sub word line driver are arranged on one side of the cell array and multiplexer has been explained. However, the present invention is not limited to this. The driver and sub word line driver may also be arranged on the two sides of the cell array and multiplexer.

In the above-described embodiments and modifications, the example in which the transistor of the multiplexer is configured as a buried gate transistor or planar transistor has been explained. However, the present invention is not limited to this. The transistor of the multiplexer may also be configured as other transistor. For example, the transistor may also be configured as a saddle fin type buried gate transistor. The gate of the saddle fin type buried gate transistor has a saddle fin structure surrounding the upper surface and X-direction side surfaces of a portion of a diffusion layer. Since, therefore, the channel width is secured in a limited area in the saddle fin type buried gate transistor, it is readily possible to downsize the transistor.

In the above-described embodiments and modifications, the example in which the memory device is configured as a resistance change memory device has been explained. However, the present invention is not limited to this. The resistance change memory device may also be a magnetic memory device such as an STT (Spin-Transfer Torque) type MRAM (Magnetoresistive Random Access Memory), and may also be a ReRAM (Resistive Random Access Memory), PRAM, or PCRAM (Phase Change Random Access Memory). A resistance change element used in the STT-MRAM is, e.g., a magnetoresistive effect element.

A configuration example of an MTJ (Magnetic Tunnel Junction) element as the magnetoresistive effect element will be explained with reference to FIG. 25. FIG. 25 schematically shows a configuration example of a memory element of a memory device according to an embodiment.

The MTJ element is so configured as to take different resistance states in accordance with the direction of an electric current flowing through the MTJ element. A phenomenon in which the resistance changes in accordance with the state is called the magnetoresistive effect. The MTJ element holds data by using the magnetoresistive effect.

As shown in FIG. 25, the MTJ element includes at least a fixed layer 81, a recording layer 82, and an insulating layer 83 provided between them. The fixed layer 81, insulating layer 83, and recording layer 82 form an MTJ (Magnetic Tunnel Junction). A ferromagnetic layer 84 fixes the magnetization in the fixed layer 81. The recording layer 82 has a magnetization which changes in accordance with the direction of a write current flowing through the layer. Electrode layers 85 and 86 are provided to sandwich the ferromagnetic layer 84, fixed layer 81, recording layer 82, and insulating layer 83. As in the above-described embodiments, the electrode layers 85 and 86 can be replaced with plug contacts such as the contacts TE and BEC.

The MTJ element shows different resistance states in accordance with the relative relationship between the magnetization directions in the fixed layer 81 and recording layer 82. More specifically, the magnetization directions in the fixed layer 81 and recording layer 82 of the MTJ element take a parallel state (low-resistance state) or antiparallel state (high-resistance state), and these different resistance states are made to correspond to, e.g., two values of 1-bit data.

Note that the MTJ element can be either a vertical magnetization MTJ element having vertical magnetic anisotropy, or a horizontal magnetization MTJ element having horizontal magnetic anisotropy. Also, the MTJ element can be either a top free (bottom pinned) MTJ element in which the recording layer is arranged above the fixed layer, or a bottom free (top pinned) MTJ element in which the recording layer is arranged below the fixed layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A memory device comprising:
    a first memory cell array;
    a second memory cell array;
    a multiplexer arranged between the first memory cell array and the second memory cell array, the multiplexer controlling the first memory cell array and the second memory cell array, and the multiplexer including a transistor;
    a first line connecting the first memory cell array and the second memory cell array, the transistor driving the first memory cell array and the second memory cell array by controlling an electrical connection of the first line;
    a second line connecting the first memory cell array and the second memory cell array; and
    a third line connected to the first line via the transistor, the third line being connected to a first end of the transistor via a first contact arranged between the first and second lines, and the first line being connected to a second end of the transistor via a second contact.

2. The device according to claim 1, wherein:
    the third line is arranged above the first and second lines, and
    the transistor is arranged below the first and second lines.

3. The device according to claim 1, further comprising a fourth line adjacent to the third line,
    wherein a pitch of the first and second lines is narrower than that a pitch of the third and fourth lines.

4. The device according to claim 1, further comprising a plate interconnection between the first memory cell array and the second memory cell array,
    wherein the first contact is relayed by the plate interconnection and connects the third line and the transistor.

5. The device according to claim 4, wherein the first line includes:
    first portions extending from the first memory cell array and the second memory cell array; and
    a second portion arranged in a layer different from a layer of the first portions between the first memory cell array and the second memory cell array, and connecting the first memory cell array and the second memory cell array, and
    wherein the plate interconnection is arranged in the same layer as the first portions.

6. The device according to claim 4, wherein the first line includes:
    first portions extending from the first memory cell array and the second memory cell array; and
    a second portion arranged in a layer different from a layer of the first portions between the first memory cell array and the second memory cell array, and connecting the first memory cell array and the second memory cell array,
    wherein the second line includes:
    third portions extending from the first memory cell array and the second memory cell array; and
    a fourth portion arranged in a layer different from a layer of the third portions between the first memory cell array and the second memory cell array, and connecting the first memory cell array and the second memory cell array, and
    wherein the first contact is arranged between the second and fourth portions, and connects the third line and the transistor.

7. The device according to claim 5, further comprising a fifth line in the layer in which the second portion is arranged.

8. The device according to claim 1, wherein the transistor is one of a buried gate transistor and a planar transistor.

9. The device according to claim 1, wherein the multiplexer comprises:
    a first part controlling the first memory cell array; and
    a second part controlling the second memory cell array, and
    wherein the device further comprises a driver driving both of the first and second parts.

10. The device according to claim 1, wherein the multiplexer is provided in common to the first memory cell array and the second memory cell array, and
    wherein the device further comprises a driver driving the multiplexer.

11. The device according to claim 10, further comprising a line connecting the first memory cell array and the second memory cell array,
    wherein the line includes:
    a first portion acting as a bit line; and
    a second portion acting as a source line, arranged in a same layer as a layer of the bit line.

12. The device according to claim 10, further comprising a line connecting the first memory cell array and the second memory cell array,
    wherein the line includes:
    a first portion acting as a bit line; and
    a second portion acting as a source line, arranged in a layer different from a layer of the bit line.

13. The device according to claim 10, further comprising a line connecting the first memory cell array and the second memory cell array,
wherein the line includes:
a first portion acting as a bit line; and
a second portion acting as a connection line, arranged in a layer different from a layer of the bit line.

14. The device according to claim 1, wherein the first and second memory cell arrays include resistance change elements.

15. The device according to claim 1, wherein the first and second memory cell arrays include magnetoresistive effect elements.

16. A memory device comprising:
a first memory cell array;
a second memory cell array;
a first line connecting the first memory cell array and the second memory cell array;
a second line connecting the first memory cell array and the second memory cell array;
a third line connected to the first and second lines via a transistor; and
a multiplexer including the transistor,
wherein the third line is connected to a first end of the transistor via a first contact arranged between the first and second lines,
wherein the first line is connected to a second end of the transistor via a second contact,
wherein the third line is arranged above the first and second lines, and
wherein the transistor is arranged below the first and second lines.

17. The device according to claim 16, further comprising a fourth line adjacent to the third line,
wherein a pitch of the first and second lines is narrower than a pitch of the third and fourth lines.

* * * * *